(12) United States Patent
Goyal et al.

(10) Patent No.: US 8,742,412 B2
(45) Date of Patent: Jun. 3, 2014

(54) THIN FILM TRANSISTOR USING AN OXIDE SEMICONDUCTOR AND DISPLAY

(75) Inventors: Amita Goyal, Tokyo (JP); Naho Itagaki, Fukuoka (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 201 days.

(21) Appl. No.: 12/809,096

(22) PCT Filed: Jan. 30, 2009

(86) PCT No.: PCT/JP2009/052013
§ 371 (c)(1),
(2), (4) Date: Jun. 18, 2010

(87) PCT Pub. No.: WO2009/096608
PCT Pub. Date: Aug. 6, 2009

(65) Prior Publication Data
US 2011/0175081 A1   Jul. 21, 2011

(30) Foreign Application Priority Data

Jan. 31, 2008  (JP) .................................. 2008-021009
Jan. 27, 2009  (JP) .................................. 2009-015692

(51) Int. Cl.
*H01L 29/786*   (2006.01)

(52) U.S. Cl.
USPC .................. 257/43; 257/57; 257/63; 257/84; 438/85; 438/96; 438/99; 438/104; 438/152

(58) Field of Classification Search
USPC ............... 257/43, 52, 53, 55, 57, 61, 63, 210, 257/E33.004, E31.034, E31.047, E29.101, 257/E21.297, 59, 213, E21.412, E33.001, 257/E33.037, E29.079, E29.08, E29.2, 89, 257/E29.289; 438/22, 45, 46, 148, 151, 438/162, 237, 482, 608, 930, FOR. 184, 438/FOR. 206

See application file for complete search history.

(56) References Cited

U.S. PATENT DOCUMENTS

| | | | |
|---|---|---|---|
| 5,593,335 A | 1/1997 | Suzuki et al. | 445/50 |
| 6,160,347 A | 12/2000 | Iwasaki et al. | 313/545 |
| 6,231,412 B1 | 5/2001 | Kawade et al. | 445/3 |

(Continued)

FOREIGN PATENT DOCUMENTS

| | | |
|---|---|---|
| CN | 1950951 A | 4/2007 |
| JP | 2007-073703 | 3/2007 |

(Continued)

OTHER PUBLICATIONS

Office Action dated Dec. 1, 2011, issued in counterpart of the present application, Korean Patent Application No. 10-2010-7018931, with translation.

(Continued)

*Primary Examiner* — Olik Chaudhuri
*Assistant Examiner* — Quovaunda V Jefferson
(74) *Attorney, Agent, or Firm* — Fitzpatrick, Cella, Harper & Scinto

(57) ABSTRACT

A thin film transistor includes a gate electrode, a gate insulation layer, a channel layer, a source electrode, and a drain electrode formed on a substrate, in which: the channel layer contains indium, germanium, and oxygen; and the channel layer has a compositional ratio expressed by In/(In+Ge) of 0.5 or more and 0.97 or less.

14 Claims, 33 Drawing Sheets

(56) References Cited

U.S. PATENT DOCUMENTS

| | | |
|---|---|---|
| 6,936,854 B2 | 8/2005 | Iwasaki et al. ............... 257/81 |
| 6,970,610 B2 | 11/2005 | Iwasaki ............... 385/14 |
| 7,145,174 B2 | 12/2006 | Chiang et al. ............... 257/59 |
| 7,189,992 B2 | 3/2007 | Wager, III et al. ............... 257/43 |
| 7,242,039 B2 | 7/2007 | Hoffman et al. ............... 257/213 |
| 7,282,782 B2 | 10/2007 | Hoffman et al. ............... 257/613 |
| 7,297,977 B2 | 11/2007 | Hoffman et al. ............... 257/43 |
| 7,411,209 B2 | 8/2008 | Endo et al. ............... 257/43 |
| 7,453,087 B2 | 11/2008 | Iwasaki ............... 257/59 |
| 7,473,942 B2 | 1/2009 | Iwasaki et al. ............... 257/103 |
| 7,935,582 B2 | 5/2011 | Iwasaki ............... 438/151 |
| 2002/0066902 A1* | 6/2002 | Takatoku ............... 257/72 |
| 2005/0199880 A1* | 9/2005 | Hoffman et al. ............... 257/72 |
| 2005/0199961 A1* | 9/2005 | Hoffman et al. ............... 257/368 |
| 2006/0110867 A1 | 5/2006 | Yabuta et al. ............... 438/151 |
| 2006/0113565 A1 | 6/2006 | Abe et al. ............... 257/197 |
| 2007/0194379 A1 | 8/2007 | Hosono et al. ............... 257/347 |
| 2009/0065771 A1 | 3/2009 | Iwasaki et al. ............... 257/43 |
| 2009/0134427 A1 | 5/2009 | Oike et al. ............... 257/103 |
| 2009/0174012 A1 | 7/2009 | Iwasaki ............... 257/410 |
| 2009/0189153 A1 | 7/2009 | Iwasaki et al. ............... 257/43 |
| 2009/0269880 A1 | 10/2009 | Itagaki et al. ............... 438/104 |
| 2010/0092800 A1 | 4/2010 | Itagaki et al. ............... 428/697 |
| 2010/0109002 A1 | 5/2010 | Itagaki et al. ............... 257/43 |
| 2010/0224870 A1 | 9/2010 | Iwasaki et al. ............... 257/43 |

FOREIGN PATENT DOCUMENTS

| | | |
|---|---|---|
| JP | 2007-103918 | 4/2007 |
| JP | 2008-243928 A | 10/2008 |
| JP | 2008-243929 A | 10/2008 |
| WO | WO 2007/032294 A1 | 3/2007 |
| WO | WO 2007/086291 A1 | 8/2007 |
| WO | WO 2007/119321 A2 | 10/2007 |

OTHER PUBLICATIONS

K. Nomura et al., "Room-temperature fabrication of transparent flexible thin-film transistors using amorphous oxide semiconductors," Nature, vol. 432, pp. 488-492, Nov. 25, 2004.

B. Yaglioglu et al., "High-mobility amorphous $In_2O_3$-10 wt % ZnO thin film transistors," Applied Physics Letters, vol. 89, pp. 062103-1-062103-3, Aug. 7, 2006.

P. Barquinha et al., "Effect of UV and visible light radiation on the electrical performances of transparent TFTs based on amorphous indium zinc oxide," Journal of Non-Crystalline Solids, vol. 352, pp. 1756-1760, Apr. 18, 2006.

R.E. Presley et al., "Transparent ring oscillator based on indium gallium oxide thin-film transistors," Solid-State Electronics, vol. 50, pp. 500-503, Mar. 31, 2006.

Office Action dated Jul. 1, 2011, issued in counterpart PRC Patent Application 200980103882.1, with translation.

Office Action issued on Jun. 21, 2013 in Taiwan (ROC) counterpart patent application 098103245, with translation.

Office Action issued on Aug. 1, 2013 in Japanese counterpart patent application 2009-015692, with partial translation.

* cited by examiner

FIG. 26
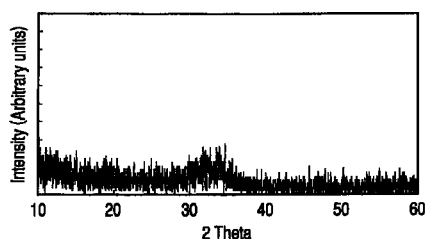
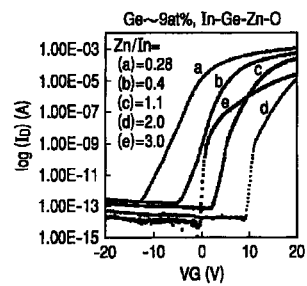
FIG. 27A
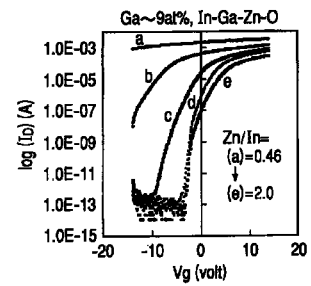
FIG. 27B

THIN FILM TRANSISTOR USING AN OXIDE SEMICONDUCTOR AND DISPLAY

TECHNICAL FIELD

The present invention relates to a thin film transistor that uses an oxide semiconductor. More particularly, the present invention relates to a thin film transistor for use in an organic electro-luminescence display, an inorganic electro-luminescence display, or a liquid crystal display, and a display that uses this thin film transistor.

BACKGROUND ART

A field effect transistor (FET) has a gate electrode, a source electrode, and a drain electrode. It is an electronic active element for applying a voltage to the gate electrode to control a current flowing through a channel layer and switch the current flowing between the source electrode and the drain electrode.

Particularly, an FET formed by using a thin film which is formed on an insulating substrate made of, for example, ceramics, glass, or plastic, for a channel layer is called a thin film transistor (TFT).

A number of thin film transistors (TFTs) are formed on a substrate having a large area to be used in a wide variety of applications. For example, TFTs are essential elements for a flat panel display.

Conventionally, TFTs and relevant electronic devices are fabricated on a glass substrate.

Future display systems are required to be larger in size and more portable, in addition to having higher performance. As the size of the glass substrate increases, the weight of the display matters more.

One solution is to develop a display system that uses a flexible plastic substrate. In other words, a new thin film transistor technology which can fabricate a device on a plastic substrate at a process temperature lower than the current one and which provides better display performance is required to be developed.

The TFT which is most widely used at present is an element having a channel layer formed of a polycrystalline silicon film or an amorphous silicon film. For driving pixels, an amorphous silicon TFT is put into practical use, and for driving and controlling an entire image, a polycrystalline silicon TFT having a high performance is put into practical use.

However, it is difficult to form TFTs that have heretofore been developed, including the amorphous silicon TFT and the polysilicon TFT, on a substrate such as a plastic plate or film because a high-temperature process is necessary for forming a device.

On the other hand, in recent years, development for realizing a flexible display by forming TFTs on a polymer plate or film and using the TFTs as drive circuits for an LCD or an OLED has been vigorously conducted.

As a material capable of being formed on the plastic film or the like, an organic semiconductor film which can be formed at low temperature and exhibits electric conductivity has been attracting attention.

For example, as the organic semiconductor film, research and development of pentacene or the like are advanced. Its carrier mobility is reported to be about $0.5\ cm^2(Vs)^{-1}$, which is equivalent to the carrier mobility of amorphous Si-MOS-FETs.

However, the organic semiconductor such as pentacene has low heat stability (<150° C.) and is toxic, and hence a practical device has not been realized.

Recently, as a material applicable to the channel layer of TFT, an oxide material has been attracting attention. For example, development of TFTs in which a transparent conductive oxide polycrystalline thin film mainly made of ZnO is used as the channel layer has been vigorously conducted.

The above-mentioned thin film can be formed at relatively low temperature and can be formed on a substrate such as a plastic plate or film.

However, a compound mainly made of ZnO cannot form a stable amorphous phase at room temperature, and forms a polycrystalline phase. Accordingly, it is impossible to increase the electron mobility due to scattering at polycrystalline particle interfaces. In addition, the shapes of the polycrystalline particles and the interconnections therebetween vary to a large extent depending on the film forming method, and hence characteristics of the TFT device also vary.

Recently, K. Nomura et al., Nature, vol. 432, pp 488-492 (2004-11) (hereinafter referred to as Non-Patent Document 1), reports a thin film transistor using an In—Ga—Zn—O-based amorphous oxide.

The transistor can be formed on a plastic substrate or a glass substrate at room temperature. Further, transistor characteristics of a normally-off type transistor are obtained when the field effect mobility is about 6 to 9 $cm^2$/V s.

In addition, the transistor has a characteristic of being transparent to visible light.

In the above document, the amorphous oxide having a compositional ratio of In:Ga:Zn=1.1:1.1:0.9 (at %) is used for the channel layer of a TFT.

Reports of conventional In—Ga—Zn—O-based oxides (Non-Patent Document 1) and WO 2007/032294 A1 (hereinafter referred to as Patent Document 1)) are known as examples of a polynary oxide semiconductor that contains three different metal elements.

Those reports have attracted much attention from researchers and industry.

In order to put a TFT made from an oxide material into industrial uses, a desirable oxide material is one that allows the TFT to operate in a wide composition range (i.e., having a large composition margin) and that contains fewer different metal elements. Using an oxide material like this is very advantageous in terms of uniformity, better control of TFT characteristics, and manufacturing cost.

The drive TFT and switching TFT of an active matrix organic light emitting diode (AMOLED) are required to have high device stability and operation stability over time in addition to other required TFT characteristics.

Also requested is further to enhance the metal element composition margin (e.g., In/(In+Ga+Zn) or Zn/(Zn+In+Ga)). The present invention discloses an In—Ge—Zn—O-based oxide as an oxide semiconductor that contains three different metal elements. An effect of the oxide semiconductor (In—Ge—Zn—O-based) of the present invention when used in a TFT is that the composition margin is larger than that of a conventional oxide-based semiconductor that employs two or three different metal elements. The composition margin with respect to the TFT operation depends greatly on whether or not the channel material has electric characteristics of a semiconductor and whether or not the channel material is amorphous.

Having a large composition margin is a great advantage in mass production where a film needs to be formed over a large area and/or at high speed. Also, a semiconductor material for use in TFT is requested to be small in the amount of expensive or rare elements (In, Ga, or the like) contained therein, in order to keep the cost low.

An object of the present invention is therefore to provide a thin film transistor that solves the above-mentioned problems.

DISCLOSURE OF THE INVENTION

As means for solving the above-mentioned problem, the present invention provides a thin film transistor comprising a gate electrode, a gate insulation layer, a channel layer, a source electrode, and a drain electrode formed on a substrate, in which the channel layer contains indium, germanium, and oxygen, and the channel layer has a compositional ratio expressed by In/(In+Ge) of 0.5 or more and 0.97 or less.

Further, according to some embodiments of the present invention, the channel layer has a compositional ratio expressed by In/(In+Ge) of 0.5 or more and 0.90 or less.

Fine TFT characteristics in terms of on/off ratio, and sub-threshold swing value are thus obtained.

Further, according to some embodiments of the present invention, the channel layer has a compositional ratio expressed by In/(In+Ge) of 0.6 or more and 0.9 or less.

Fine TFT characteristics in terms of on/off ratio, sub-threshold swing value and mobility are thus obtained.

Further, according to some embodiments of the present invention, the channel layer has a compositional ratio expressed by In/(In+Ge) of 0.5 or more and 0.85 or less.

Fine TFT characteristics in terms of on/off ratio, mobility, sub-threshold swing value and threshold voltage are thus obtained.

Further, according to some embodiments of the present invention, the channel layer has a compositional ratio expressed by In/(In+Ge) of 0.6 or more and 0.75 or less.

Excellent normally-off transistor characteristics such as a fine sub-threshold swing value, on/off ratio, threshold voltage, and mobility are thus obtained.

Further, according to some embodiments of the present invention, the channel layer has a specific resistivity of $10^3$ $\Omega \cdot cm$ to $10^6$ $\Omega \cdot cm$.

Further, according to some embodiments of the present invention, the channel layer is amorphous.

A transistor that has high stability against environment and high drive stability (experiences less characteristics fluctuation when driven) is thus realized.

TFTs are used not only as switching devices but also as analog current drivers for an organic light emitting diode (OLED), where a change in threshold voltage Vth changes the individual pixel brightness (emission brightness). Long-term stability is therefore important to analog devices.

The present invention accomplishes very high device stability and drive stress stability under ambient environmental conditions in an In/(In+Ge) composition range of 0.5 or more and 0.75 or less.

Further, according to the present invention, the gate insulation layer is made of a silicon oxide.

A highly reliable field effect transistor that has excellent transistor characteristics in terms of $\mu_{FE}$, on/off ratio, Vth, and S value, among others, can thus be provided.

An In—Zn—O-based material (Applied Physics Letters, Volume 89, Issue 06, 2006, page 2103, hereinafter referred to as Non-Patent Document 2) has been reported as an example of an oxide constituted of two different metal elements. Another example is an In—Ga—O-based material (Solid-State Electronics, Volume 50, 2006, pages 500-503, hereinafter referred to as Non-Patent Document 3).

According to the experiment results studied by the present inventors, a TFT using an In—Zn—O-based material has an environment stability that depends on the composition, and the In/(In+Zn) composition range in which the TFT steadily exhibits fine characteristics is not so wide. On the other hand, a TFT using an In—Ga—O-based material has a small on/off ratio and a large S value.

An In—Ge—O-based TFT of the present invention can operate in a wider composition range than other TFTs that use a two-metal element oxide, including In—Zn—O-based TFTs.

Compared to the In—Zn—O-based oxide (Non-Patent Document 2) and the In—Ga—O-based oxide (Non-Patent Document 3), the TFT of the present invention is superior in stability and performance.

The present invention includes a thin film transistor whose channel is formed from an oxide semiconductor containing Zn, In, and Ge, and the thin film transistor is characterized in that the In/(In+Ge) compositional ratio of the channel is 0.50 or more and 0.97 or less, and that the Zn/(Zn+In+Ge) compositional ratio of the channel is 0.80 or less.

The present invention also provides a field effect transistor comprising a channel formed from an oxide that contains Zn, In, and Ge, wherein the oxide has a composition within a range surrounded by a, b, c, and d in FIG. 57. In this composition range, a high on/off current ratio ($10^6$ or higher) can be obtained.

Further, according to the present invention, in the field effect transistor, the oxide has a composition within a range surrounded by a, b, e, m, and l in FIG. 57. In this composition range, a high on/off current ratio ($10^9$ or higher) and a fine mobility ($\geq 3$ $cm^2/V \cdot s$) can be obtained.

Further, according to the present invention, in the field effect transistor, the oxide has a composition within a range surrounded by a, b, e, f, and g in FIG. 57. In this composition range, a high on/off current ratio ($10^9$ or higher) and a fine (small) subthreshold swing value S (V/dec) can be obtained.

Further, according to the present invention, in the field effect transistor, the oxide has a composition within a range surrounded by a, n, t, and h in FIG. 57. In this composition range, a high on/off current ratio ($10^9$ or higher), a high mobility ($\geq 7$ $cm^2/V \cdot s$), and a small subthreshold swing value (S (V/dec)$\leq 0.7$) can be obtained.

Further, according to the present invention, in the field effect transistor, the oxide has a composition within a range surrounded by h, i, b, e, k, and l in FIG. 57. In this composition range, a high on/off current ratio ($10^9$ or higher), a fine mobility ($\geq 3$ $cm^2/V \cdot s$), and a fine threshold voltage Vth (V) can be obtained.

Further, according to the present invention, in the field effect transistor, the oxide has a composition within a range surrounded by h, i, n, and t in FIG. 57. In this composition range, a high on/off current ratio ($10^9$ or higher), a fine mobility ($\geq 7$ $cm^2/V \cdot s$), a small S value (S(V/dec)$\leq 0.7$), and a fine threshold voltage Vth (V) can be obtained.

Further, according to the present invention, in the field effect transistor, the oxide has a composition within a range surrounded by 's', 'u', 'x', 'y', 'v', and 'b' in FIG. 57. In this composition range, a high on/off current ratio ($10^{10}$ or higher), a fine mobility ($\geq 9$ $cm^2/V \cdot s$), a small S value (S(V/dec)$\leq 0.5$), and a fine threshold voltage Vth (V) can be obtained.

Further, according to the present invention, in the field effect transistor, the oxide has a composition within a range surrounded by s, u, t, and n in FIG. 57, and its off current is very small (off current $\leq 10^{-13}$ (A)).

Further, according to the present invention, in the field effect transistor, the oxide has a composition within a range enclosed by a, b, c, and d and outside a range enclosed by the broken line in FIG. 57, and the oxide is amorphous.

A TFT using an In—Ge—O-based oxide thus has a larger composition margin than that of TFTs based on the oxides described in Non-Patent Documents 2 and 3 and other materials. Compared to the three-metal element oxide In—Ga—Zn—O of Non-Patent Document 1, an In—Ge—O-based oxide of the present invention which is advantageous in terms of manufacturing cost as it is constituted of only two metal elements.

According to the present invention, a material is obtained which uses fewer elements and therefore is very cost-effective in obtaining fine TFT performance. Another advantage is that the oxide semiconductor of the present invention (e.g., In—Ge—O) has, when used for a TFT, a very large composition margin among TFTs based on a two-metal element oxide material. In short, the present invention has an effect of keeping a change in characteristics due to a composition change small.

Also, a high on/off ratio and a fine mobility are obtained throughout an In/(In+Ge) composition range of 0.5 and more and 0.9 or less.

According to the present invention, TFT characteristics can be controlled and the TFT performance can be improved by controlling the In—Ge compositional ratio. For instance, TFT performance measured by subthreshold swing value (S value (V/Dec)), on/off current ratio (on/off), field effect mobility $\mu_{FE}$ (cm$^2$/Vsec), threshold voltage Vth (V), and turn-on voltage Von (V) can be greatly improved.

Further features of the present invention will become apparent from the following description of exemplary embodiments with reference to the attached drawings.

BRIEF DESCRIPTION OF THE DRAWINGS

FIG. 26 is a graph illustrating an X-ray diffraction pattern of an In:Ge:Zn:O film in which the compositional ratio In:Ge:Zn is 42:13:45.

FIGS. 27A and 27B are graphs comparing transfer characteristics of an In—Ge—Zn—O-based TFT and transfer characteristics of an In—Ga—Zn—O-based TFT, with FIG. 27A set to Ge is approximately equal to 9 at % and FIG. 27B set to Ga is approximately equal to 9 at %, and each illustrating dependency of Zn/In ratio.

DETAILED DESCRIPTION OF THE EMBODIMENTS

The best mode for carrying out the present invention is described below with reference to the accompanying drawings.

Figure 1A:
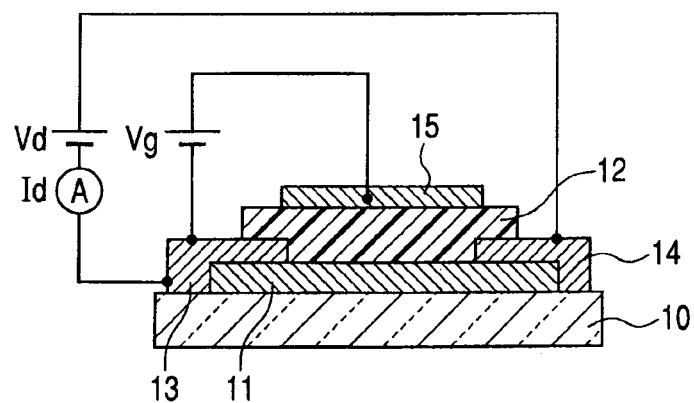
FIGS. 1A, 1B and 1C are cross-sectional views outlining a thin film transistor that contains amorphous In—Ge—O according to an embodiment of the present invention.
Figure 1B:
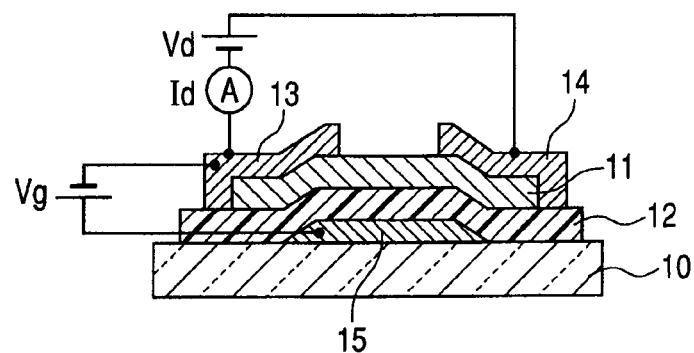
Figure 1C:
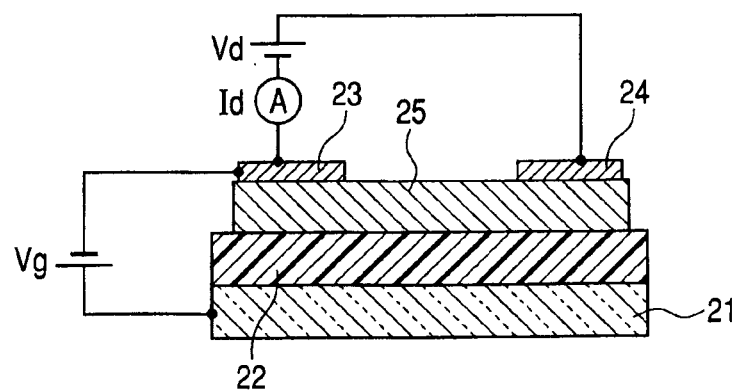

FIGS. 1A to 1C are sectional views outlining thin film transistors that contain amorphous In—Ge—O according to an embodiment of the present invention.

In FIGS. 1A and 1B, reference numeral 10 denotes a substrate; 11, a channel layers (oxide thin films); 12, a gate insulation layer; 13, a source electrode; 14, a drain electrode; and 15, a gate electrode.

A field effect transistor is a three-terminal device having the gate electrode 15, the source electrode 13, and the drain electrode 14.

The field effect transistor is an electronic device in which a drain current $I_D$ flowing through the channel layer can be controlled by applying a voltage $V_G$ to the gate electrode, and a current flowing between the source electrode and the drain electrode is thus controlled.

FIG. 1A is an example of a top gate structure which has the gate insulation layer 12 and the gate electrode 15 on the semiconductor channel layer 11. FIG. 1B is an example of a bottom gate structure which has the gate insulation layer 12 and the semiconductor channel layer 11 on the gate electrode 15. FIG. 1C is another example of the bottom gate transistor.

In FIG. 1C, a channel layer (oxide) 25 is placed above a substrate 21 on which a gate insulator 22 made of thermally oxidized $SiO_2$ is formed. Reference numerals 23 and 24 denote a source electrode and a drain electrode, respectively. The substrate 21 is formed from n-Si and also functions as a gate electrode.

The TFT of the present invention is not limited to the above structures and can employ any structure, including top gate, bottom gate, and staggered structures.

(Channel Layer: In—Ge—O-Based)

The thin film transistor of the present invention is characterized by its channel layer being formed from an amorphous oxide containing indium and germanium.

An amorphous oxide constituted of an amorphous oxide of In and Ge (In—Ge—O), or an amorphous oxide of Ge and Zn (Zn—Ge—O), or an amorphous oxide of In, Zn, and Ge (In—Zn—Ge—O) is a particularly desirable material. Other amorphous oxides or the like that contain In and Ge may be employed.

In the present invention, the ratio of In to all the elements that constitute an amorphous oxide is 10% or more and 40% or less. An In—Ge—O amorphous oxide contains oxygen most of all the three containing elements, the indium content is second largest, and the germanium content is third largest.

A Zn—Ge—O amorphous oxide contains oxygen most of all the three containing elements, the zinc content is second largest, and the germanium content is third largest.

An In—Zn—Ge—O amorphous oxide contains oxygen most of all the four containing elements, the zinc (or indium) content is second largest, the indium (or zinc) content is third largest, and the germanium content is fourth largest.

A preferred composition range of an In—Ge—O material when used for an active layer of a TFT is described first.

An In—Ge—O-based material can form an amorphous thin film throughout a relatively wide range of In/(In+Ge) compositional ratio. For example, depositing the material by sputtering at room temperature produces an amorphous oxide thin film when the condition that Ge/(In+Ge)>0.03 is satisfied.

As described above, a ZnO thin film formed by sputtering has a polycrystalline structure and, depending on the grain size and grain boundary effects, may adversely affect the performance of the TFT. Therefore, from the standpoint of TFT performance, it is very important for an oxide forming a channel to be amorphous.

TFT characteristics are examined next.

Figure 2:
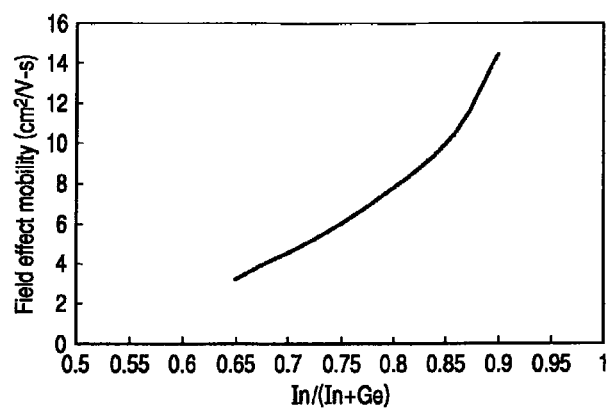
FIG. 2 is a graph illustrating an example of the field effect mobility ($\mu_{FE}$) as a function of an In/(In+Ge) compositional ratio when a thin film transistor is fabricated.

FIG. 2 is a graph illustrating an example of the electron field effect mobility ($\mu_{FE}$) as a function of the In/(In+Ge) compositional ratio of a material used to fabricate a thin film transistor.

As illustrated in FIG. 2, a high on/off ratio and a fine mobility are obtained throughout a wide In/(In+Ge) composition range of 0.6 or more and 0.9 or less. The field effect mobility rises as the ratio of contained In increases.

The field effect mobility is one of the most important electric parameters of a TFT in order to quantify the performance of a semiconductor channel layer, which particularly affects the current drive ability and the maximum switching frequency.

The required mobility varies depending on the intended use. For example, to use in a liquid crystal display device, the field effect mobility is desirably 0.1 $cm^2$/Vsec or more. For use in an organic EL display device, the field effect mobility is desirably 1 $cm^2$/N s or more.

In the present invention, a mobility suitable for driving an organic EL device (OLED) can be obtained at an In/(In+Ge) compositional ratio of 0.6 or more and 0.97 or less. Using an In/(In+Ge) compositional ratio of 0.6 or more and 0.75 or less is more desirable since it gives an excellent threshold and S value to the TFT. A threshold voltage Vth of a thin film transistor is preferably 0 V or higher because circuit construction is easy at that level of threshold voltage.

Figure 3:
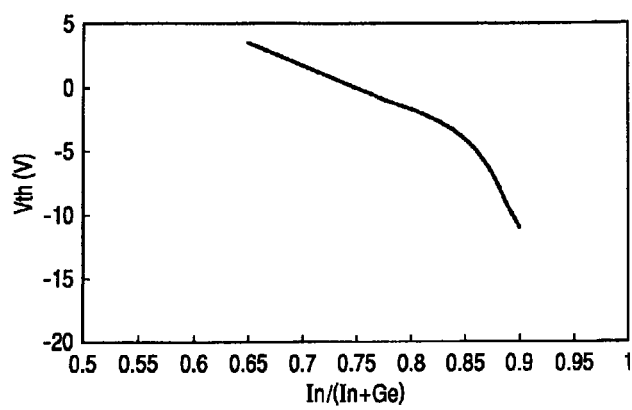
FIG. 3 is a graph illustrating composition dependency of threshold voltage of an In—Ge—O-based thin film transistor.

FIG. 3 is a graph illustrating the composition dependency of the threshold voltage of an In—Ge—O-based thin film transistor.

It can be seen in FIG. 3 that Vth is positive when In/(In+Ge) is 0.65 or more and 0.75 or less. Taking a subthreshold swing value S (V/Dec) into account, a composition range between 0.65 and 0.75 where a very small S value is obtained is highly desirable.

Figure 4:
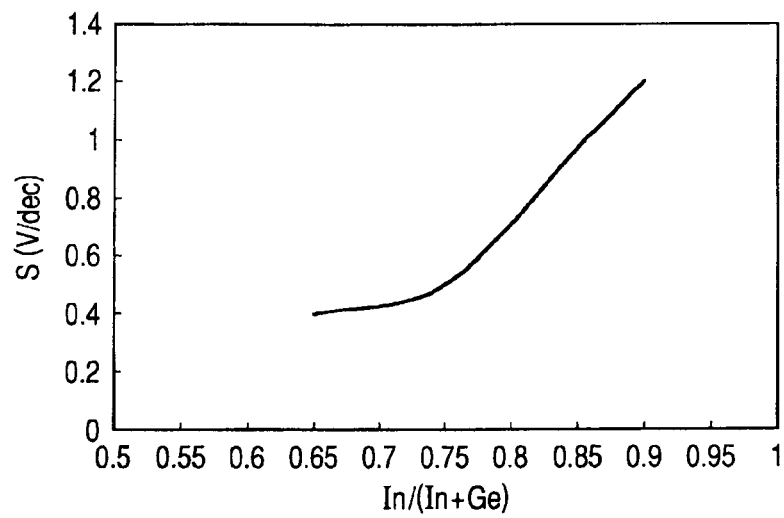
FIG. 4 is a graph illustrating an example of a change in subthreshold swing value S (V/dec) as a function of the In/(In+Ge) compositional ratio.

FIG. 4 is a graph illustrating an example of a change in subthreshold swing value S (V/dec) as a function of the In/(In+Ge) compositional ratio.

In conclusion, when In—Ge—O is employed in the channel layer of a thin film transistor, the TFT can operate in a wide In/(In+Ge) composition range of 0.5 or more and 0.97 or less. A particularly desirable compositional ratio is 0.6<In/(In+Ge)<0.75.

The oxide (channel layer) thickness is desirably between 10 nm and 200 nm, more desirably, between 25 nm and 70 nm.

The specific resistivity of the oxide film should be an appropriate value from the standpoint of ensuring fine TFT characteristics. In order to obtain excellent TFT characteristics, using an amorphous oxide film that has a specific resistivity $\rho$ on the order of $10^3$ $\Omega \cdot cm$ or more and $10^5$ $\Omega \cdot cm$ or less in the channel layer is desirable.

The present inventors have found out as a result of an extensive research that a TFT has an inclination to exhibit so-called normally-off characteristics when an oxide semiconductor having an appropriate specific resistivity ($\geq 10^3$ $\Omega \cdot cm$) is employed in the channel layer.

A transistor exhibiting normally-off characteristics means that, when gate voltage is not applied, the threshold voltage is positive and the transistor is turned off.

The specific resistivity of the film can be controlled by controlling the metal element composition, the oxygen partial pressure in film formation, the film thickness, conditions of post-film formation annealing, and the like.

Figure 5:
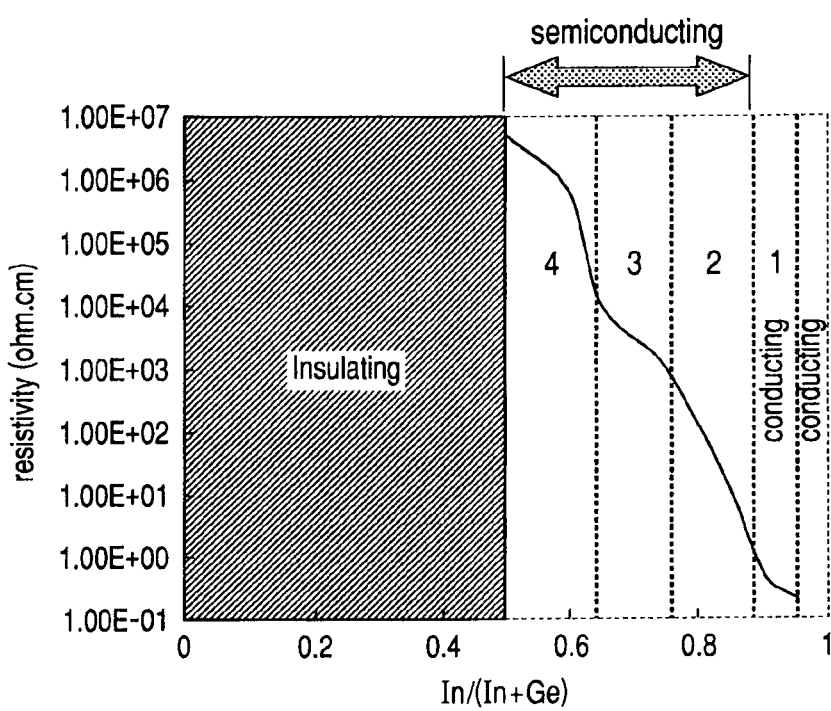
FIG. 5 is a graph illustrating dependency of specific resistivity on the compositional ratio In/(In+Ge).

FIG. 5 is a graph illustrating the dependency of the specific resistivity on the compositional ratio In/(In+Ge).

As illustrated in FIG. 5, the specific resistivity of the film increases as the composition shifts from an In-rich composition region to a Ge-rich composition region.

Specifically, as illustrated in FIG. 5, the film changes from a conductor (smaller than $10^{-1}$ $\Omega \cdot cm$) to a semiconductor (between 1 $\Omega \cdot cm$ and $10^6$ $\Omega \cdot cm$), and from a semiconductor to an insulator (larger than $10^7$ $\Omega \cdot cm$).

In order to obtain a TFT that has high threshold and excellent temporal stability, the oxide preferably contains Ge at a Ge/(Ge+In) ratio higher than 0.25.

In other words, the oxide needs to contain In at an In/(Ge+In) ratio of 0.75 or less in order to enhance the stability. Desirably, an amorphous oxide film that contains an electron carrier density of about $10^{14}$ to $10^{18}/cm^3$ is formed. Whether this level of specific resistivity can be obtained depends on film formation parameters and on the composition of a material in the channel layer.

It is difficult to build a normally-off transistor at a specific resistivity smaller than $10^3$ Ω·cm). When the specific resistivity is smaller than 10 Ω·cm, raising the on/off ratio is difficult.

Figure 6:
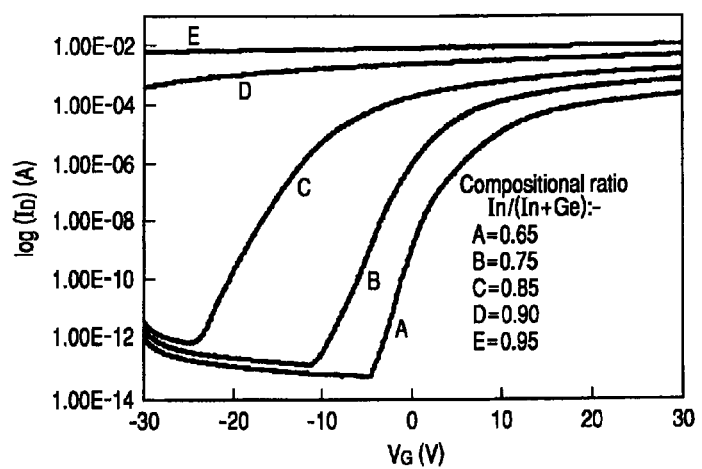
FIG. 6 is a graph illustrating an example of composition dependency of transfer characteristics of an In—Ge—O thin film transistor before annealing.

The source-drain current does not exhibit the on-off behavior despite application of gate voltage and, in extreme cases, no transistor operation is observed. This behavior can be seen in plots D and E of FIG. 6, which is of a case of the In-rich composition region where the carrier density (probably oxygen vacancy) is high. FIG. 6 is a graph illustrating an example of the composition dependency of the transfer characteristics of an In—Ge—O thin film transistor that has not received annealing.

On the other hand, when the oxide layer is an insulator, i.e., when the specific resistivity is larger than $1 \times 10^7$ Ω·cm, increasing the source-drain current becomes difficult. The inter-electrode source-drain current does not exhibit the on-off behavior despite application of gate voltage and, in extreme cases, no transistor operation is observed.

A temporal change in specific resistivity is described next. It is preferable to use an oxide semiconductor that undergoes only a small temporal change in specific resistivity because the temporal changes of the threshold voltage and off current are small in the obtained thin film transistor.

Figure 7:
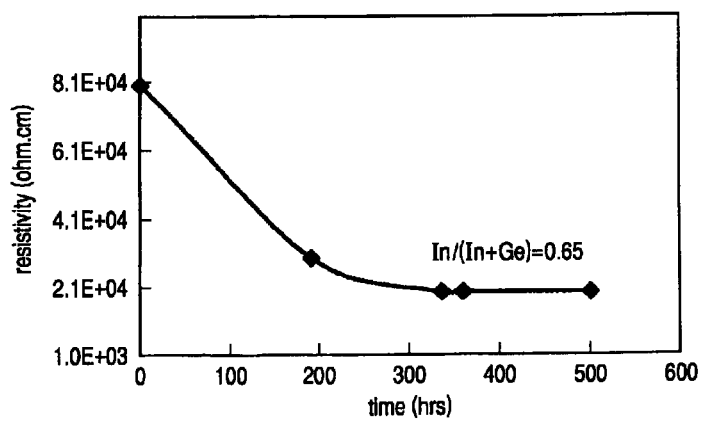
FIG. 7 is a graph illustrating temporal stability of specific resistivity when a thin film having an In/(In+Ge) compositional ratio of 0.65 is let stand in atmospheric air.

FIG. 7 is a graph illustrating the temporal stability of the specific resistivity when a thin film having an In/(In+Ge) compositional ratio of 0.65 is left in the atmospheric air.

The specific resistivity of the oxide semiconductor is observed to decrease with time for the first 300 hours or so after film formation, but ultimately becomes stable.

The specific resistivity of an annealed film becomes stable at a faster rate than that of an unannealed film.

The final specific resistivity of the Ge-rich composition region is still on the high order (>$10^3$ Ω·cm).

Steady specific resistivity corresponds to the temporal stability of TFT characteristics, and indicates that a TFT containing an In—Ge—O-based oxide has high stability.

Further, the transfer characteristics as well as TFT characteristics such as the threshold voltage and the off current hardly change with time in an In/(In+Ge) composition range of 0.5 or more and 0.75 or less.

Figure 8:
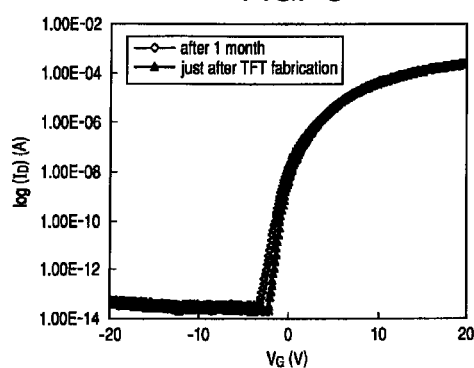
FIG. 8 is a graph illustrating an example of comparing the transfer characteristics of a TFT just after fabrication and the transfer characteristics of the TFT one month after fabrication.

FIG. 8 is a graph illustrating an example of comparing the transfer characteristics of a TFT just after fabrication and the transfer characteristics of the TFT one month after fabrication.

The temporal stability here is equal to or higher than that of a two-metal element oxide In—Zn—O.

By controlling the oxygen partial pressure during film formation, the concentration of oxygen vacancies in the thin film is controlled and, as a result, the electron carrier density can be controlled.

Figure 9:
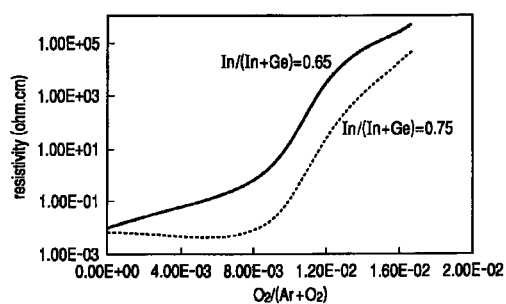
FIG. 9 is a graph illustrating an example of a change in specific resistivity of an In—Ge—O thin film when In/(In+Ge) is set to 0.65 and 0.75 and oxygen partial pressure in film formation is varied while other film formation parameters are kept constant.

FIG. 9 is a graph illustrating an example of a change in specific resistivity of an In—Ge—O thin film when In/(In+Ge) is set to 0.65 and 0.75 and the oxygen partial pressure in film formation is varied while other film formation parameters are kept constant.

(Gate Insulation Layer)

A gate insulation layer is formed from an insulator material. For example, a silicon oxide $SiO_x$ or a silicon nitride $SiN_x$ and a silicon oxynitride $SiO_xN_y$ may be used as the gate insulation layer 12. Other oxides than silicon oxides that can be used as the gate insulation layer are $GeO_2$, $Al_2O_3$, $Ga_2O_3$, $Y_2O_3$, $HfO_2$, and the like.

Of those oxides, $SiO_x$ which forms a quality film through CVD method is particularly desirable. $SiO_x$ also gives a TFT fine stability.

Accordingly, in the present invention, fine TFT performance is obtained when $SiO_2$ is used as a gate insulating material.

Using a thin film gate insulator that has excellent insulation characteristics enables adjusting the leak current between the source and gate electrodes and between the drain and gate electrodes to about $10^{-12}$ A.

The thickness of the gate insulation layer is, for example, 50 to 300 nm.

(Electrode)

A material of the source electrode 13, the drain electrode 14, and the gate electrode 15 has a high conductivity. For example, a metal electrode such as Pt, Au, Ni, W, Mo, or Ag is preferable. A transparent electrode such as $In_2O_3$:Sn or ZnO is also preferable. A cascade structure constituted of multiple layers of Au and Ti or other elements may be employed.

(Substrate)

As the substrate 10, a glass substrate, a plastic substrate, a plastic film, or the like can be used.

The above-mentioned channel layer and gate insulation layer are transparent to visible light.

Therefore, if the employed electrode material is also transparent to visible light, a thin film transistor that is all over transparent in the visible light range is created.

(Manufacturing Method)

As a method of forming a channel layer, it is desirably used a gas phase deposition method such as a sputtering method (SP method), a pulsed laser deposition method (PLD method), and an electron beam deposition method (EB method). Among the gas phase deposition methods, the SP method is suitable from the viewpoint of mass production. However, the deposition method is not limited to those methods.

A film can be formed while keeping the substrate temperature at room temperature, without intentional heat application. In this way a low-temperature manufacture process of a transparent thin film transistor on a plastic substrate can be achieved.

(Characteristics)

TFT characteristics are described next.

A field effect transistor is a three-terminal device having the gate electrode 15, the source electrode 13, and the drain electrode 14.

The field effect transistor is an electronic device in which the drain current $I_D$ flowing through the channel layer can be controlled by applying the voltage $V_G$ to the gate electrode, and a current flowing between the source electrode and the drain electrode thus exhibits the switching behavior.

The current passing through the channel is controlled by applying a drain voltage of 5 V to 20 V between the source electrode and the drain electrode and, in addition, sweeping a gate voltage of −20 V to 20 V.

Figure 10:
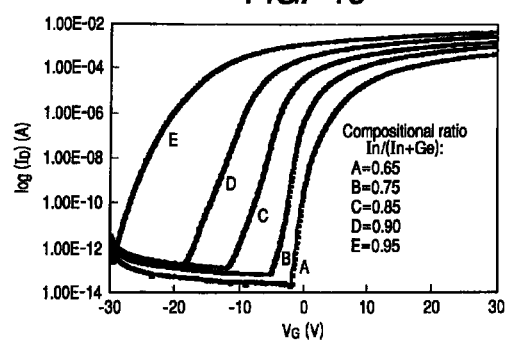
FIG. 10 is a graph illustrating an example of log($I_D$)–$V_G$ (transfer characteristics) with a drain voltage $V_D$ fixed to 6 V.

FIG. 10 is a graph illustrating an example of $\log(I_D)$-$V_G$ (transfer characteristics) with a drain voltage $V_D$ fixed to 6 V. Five plots here represent the characteristics of five TFTs that have channel layer compositions different from one another.

Figure 11:
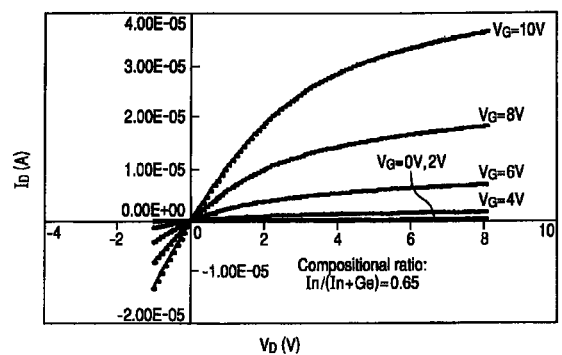
FIG. 11 is a graph illustrating an example of $I_D$ versus $V_D$ (output characteristics) at various levels of $V_G$ in a TFT that has a channel layer composition expressed as In/(In+Ge) =0.65.

FIG. 11 is a graph illustrating an example of $I_D$ versus $V_D$ (output characteristics) at various levels of $V_G$ in a TFT that has a channel layer composition expressed as In/(In+Ge)=0.65.

Figure 12:
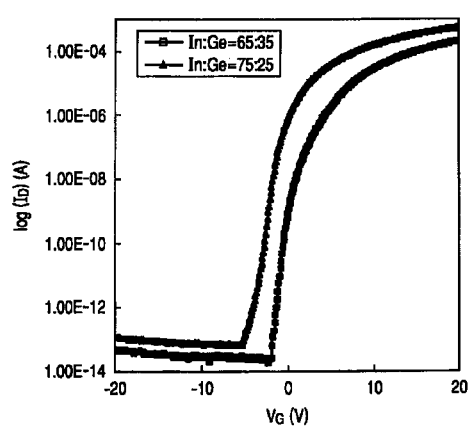
FIG. 12 is a graph illustrating two examples of the transfer characteristics of a TFT containing an In—Ge—O-based oxide that has an In/(In+Ge) compositional ratio of 0.65 and 0.75.

FIG. 12 is a graph illustrating two examples of the transfer characteristics of a TFT containing an In—Ge—O-based oxide that has an In/(In+Ge) compositional ratio of 0.65 or more and 0.75 or less.

The following Table 1 shows a list of the values of S (V/dec), on/off ratio, Von (V), Vth (V), and μ(cm²/Vsec) in those cases.

TABLE 1

| In/(In + Ge) | S(V/dec) | On/Off | Von(V) | Vth(V) | $\mu_{FE}$ (cm²/V-s) |
|---|---|---|---|---|---|
| 0.65 | 0.4 | 5E+10 | −1.9 | 3.5 | 3.4 |
| 0.75 | 0.55 | 2E+10 | −5 | 0 | 6 |

A difference between the characteristics of these transistors can be expressed as, for example, a difference in field effect mobility $\mu_{FE}$, threshold voltage (Vth), on/off ratio, and S value.

The field effect mobility can be obtained from the characteristics of a linear region or a saturation region.

Given as an example is a method of drawing the graph of √Id–Vg from transfer characteristics results and deriving the field effect mobility from the slope of the graph. This evaluation method is employed herein unless otherwise stated.

The threshold voltage can be calculated by several methods, one of which is to derive the threshold voltage Vth from x-axis intercepts of the graph of √Id–Vg.

The on/off ratio can be calculated from the ratio of the largest $I_D$ value and the smallest $I_D$ value of transfer characteristics.

The S value is derived from the reciprocal of the slope of the graph of $Log(I_D)$–$V_D$ which is drawn from transfer characteristics results.

Another option is to evaluate, as the turn-on voltage Von, a voltage (gate voltage) at the start of the sharp rising of the current in $log(I_D)$–$V_G$ characteristics.

Other various parameters than the ones mentioned above can be used to express a difference between transistor characteristics.

(Application)

The small S value, high on/off ratio of the drain current, fine mobility and normally-off characteristics that are exhibited by these TFTs are very desirable characteristics in light of TFT requirements of an OLED in future display systems.

A semiconductor device (active matrix substrate) equipped with a thin film transistor as these can have an increased aperture ratio when applied to a display because the semiconductor device uses a transparent substrate and an amorphous oxide TFT.

When applied to an organic EL display, in particular, the semiconductor device enables the display to employ a bottom emission structure in which light is emitted from the substrate side as well.

A semiconductor device of this embodiment has various possible uses including in an ID tag or IC tag.

Given below is a detailed description of a display as a specific example of a semiconductor device equipped with a field effect transistor of this embodiment.

A display is constructed by connecting an electrode of a display device such as an organic or inorganic electroluminescence (EL) device or a liquid crystal device to the drain electrode, which is an output terminal of the field effect transistor of this embodiment.

Specific examples of the display structure are described below with reference to sectional views of displays.

Figure 21:
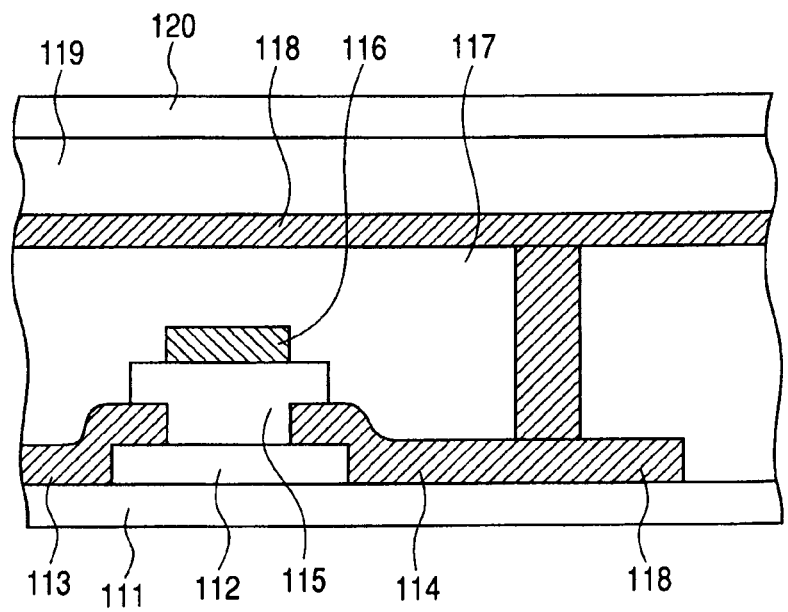
FIG. 21 is a schematic sectional view of a display according to an embodiment of the present invention.

A field effect transistor formed of, for example, a channel layer 112, a source electrode 113, a drain electrode 114, a gate insulating film 115, and a gate electrode 116 is formed on a substrate 111 as illustrated in FIG. 21.

An electrode 118 is connected to the drain electrode 114 through an interlayer insulating layer 117. The electrode 118 is in contact with a light emission layer 119, which is in contact with an electrode 120.

With this structure, a current entering the light emission layer 119 can be controlled by the value of a current that flows from the source electrode 113 to the drain electrode 114 through a channel formed in the channel layer 112.

This can therefore be controlled by the voltage of the gate electrode 116 of the field effect transistor. The electrode 118, the light emission layer 119, and the electrode 120 here constitute an inorganic or organic electroluminescence device.

Figure 22:
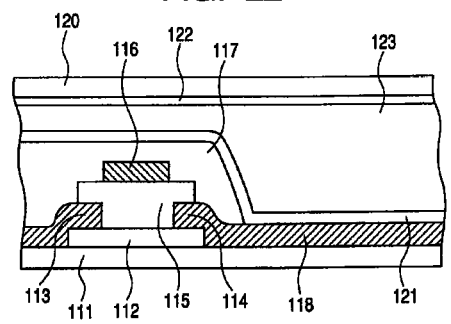
FIG. 22 is a schematic sectional view of a display according to an embodiment of the present invention.

Alternatively, the field effect transistor may take a structure illustrated in FIG. 22 where the drain electrode 114 is extended to also serve as the electrode 118, which applies a voltage to a liquid crystal cell or electrophoretic particle cell 123 sandwiched between high-resistance films 121 and 122.

The liquid crystal cell or electrophoretic particle cell 123, the high-resistance layers 121 and 122, the electrode 118, and the electrode 120 form a display device.

A voltage applied to those display devices can be controlled by the value of a current that flows from the source electrode 113 to the drain electrode 114 through a channel formed in the channel layer 112.

This can therefore be controlled by the voltage of the gate electrode 116 of the TFT. In the case where the display medium of the display device is a capsule that seals a fluid and particles inside an insulating coat, the high-resistance films 121 and 122 are unnecessary.

The thin film transistors in the above two examples take a staggered (top gate) structure as a representative structure, but the present invention is not necessarily limited to this structure. Other structures such as a coplanar structure may be employed if the connection between the drain electrode, which is an output terminal of the thin film transistor, and the display device is topologically the same.

The above two examples place a pair of electrodes that drive the display device in parallel to the base, but the present invention is not necessarily limited to this structure.

For instance, one or both of the paired electrodes may be perpendicular to the base if the connection between the drain electrode, which is an output terminal of the thin film transistor, and the display device is topologically the same.

In the case where the electrode pair driving the display device is parallel to the base and the display device is an EL device or a reflective display device such as a reflective liquid crystal device, one of the electrodes is required to be transparent with respect to the light emission wavelength or the wavelength of reflected light. In the case of a transmissive display device such as a transmissive liquid crystal device, both electrodes are required to be transparent with respect to transmitted light.

All components of a thin film transistor of this embodiment may be transparent, and hence a transparent display device can be formed. This display device can be formed on a low-heat resistant base such as a plastic resin substrate which is light-weight, flexible, and transparent.

Figure 23:
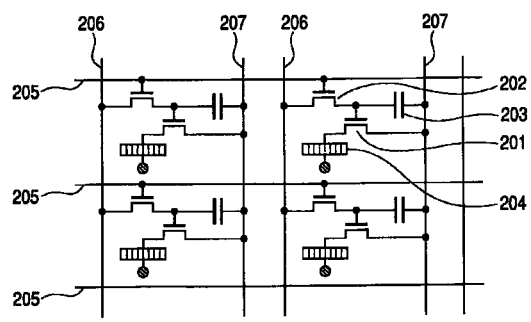
FIG. 23 is a diagram schematically illustrating a structure of a display in which pixels containing organic EL devices and thin film transistors are arranged two-dimensionally.

Described next with reference to FIG. 23 is a display in which multiple pixels containing EL devices (here, organic EL devices) and field effect transistors are arranged two-dimensionally.

FIG. 23 illustrates a transistor 201, which drives an organic EL layer 204, and a transistor 202, which selects the pixel.

A capacitor 203 is for keeping the pixel selected, and accumulates electric charges between a common electrode line 207 and the source part of the transistor 202 to hold a gate signal of the transistor 201. Pixel selection is determined by scanning electrode lines 205 and signal electrode lines 206.

To describe more specifically, a driver circuit (not shown) applies a video signal in the form of a pulse signal to the gate electrode through the relevant scanning electrode line 205. At the same time, another driver circuit (not shown) applies a pulse signal to the transistor 202 through the relevant signal electrode line 206, thereby selecting a pixel. The selection of the pixel turns the transistor 202 on, which causes the capacitor 203 interposed between the signal electrode line 206 and the source of the transistor 202 to accumulate electric charges.

The gate voltage of the transistor 201 is thus kept at a desired level and the transistor 201 is turned on. This state is maintained until the next signal is received. While the transistor 201 is on, a voltage and a current are kept supplied to the organic EL layer 204 and the organic EL layer 204 keeps emitting light.

Each pixel has two transistors and one capacitor in the example of FIG. 23. In order to improve the performance, more transistors and other components may be built in each pixel.

Another embodiment (In—Ge—Zn—O-based channel layer) of the present invention is described next.

This embodiment discloses a TFT that has an oxide channel containing a novel combination of metal elements, Zn, In, and Ge, as a TFT that possesses a large composition margin and exhibits high-performance characteristics. An In—Ge—Zn—O-based TFT of the present invention can operate in a wider composition range than an In—Ga—Zn—O-based TFT, which has an oxide channel containing In, Ga, and Zn.

Figure 24A:
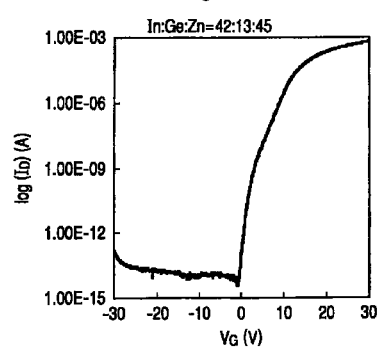
FIGS. 24A and 24B are graphs illustrating an example of transfer characteristics (log($I_D$) vs. $V_G$) and an example of output characteristics ($I_D$ vs. $V_D$) of an In—Ge—Zn—O TFT, respectively.
Figure 24B:
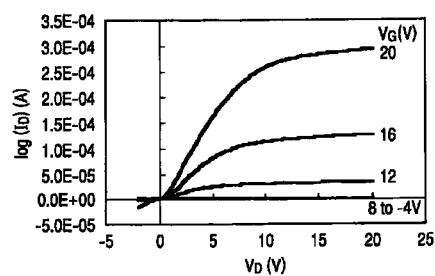
Figure 25A:
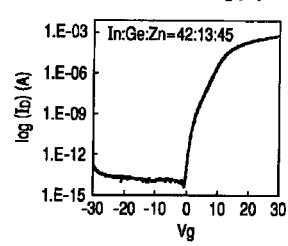
FIGS. 25A, 25B, 25C, 25D and 25E are graphs illustrating transfer characteristics (log($I_D$) vs. $V_G$), with compositional ratio In:Ge:Zn set to 42:13:45 in FIG. 25A, 51:23:26 in FIG. 25B, 32:9:59 in FIG. 25C, 32:3:65 in FIG. 25D, and 34:36:30 in FIG. 25E.
Figure 25B:
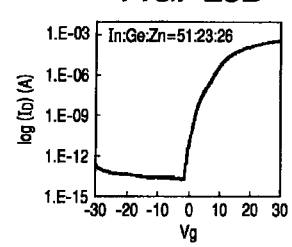
Figure 25C:
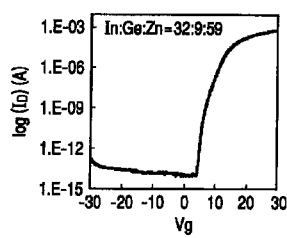
Figure 25D:
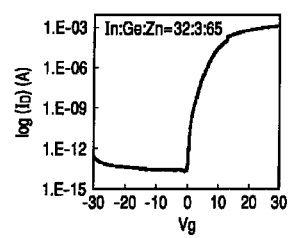
Figure 25E:
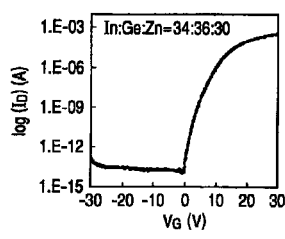

A feature of this In—Ge—Zn—O-based TFT to be noted is that it has a larger composition margin than TFTs based on materials that are described in Non-Patent Document 1 and Patent Document 1. The In—Ge—Zn—O-based TFT is capable of exhibiting stability and semiconductor characteristics equivalent to or better than those of the In—Ga—Zn—O-based TFT of Non-patent Document 2. For example, an S value of 0.5 (V/decade), a field effect mobility of about 7.00 $cm^2/Vs$, and a threshold voltage of 7.5 V are obtained as the characteristics of an In—Ge—Zn—O-based thin film transistor that has a channel layer whose metal compositional ratio is set to In:Ge:Zn=42:13:45. FIG. 24A illustrates the transfer characteristics (Log(Id) vs. Vg) of an In—Ge—Zn—O-based TFT that is set to In:Ge:Zn=42:13:45. FIG. 24B illustrates output characteristics.

Another feature to be noted is that the In—Ge—Zn—O-based TFT has a larger process margin upon fabrication than TFTs based on the materials of Non-Patent Document 1 and Patent Document 1. In particular, the In—Ge—Zn—O-based TFT experiences only a small change in characteristics due to the oxygen partial pressure in thin film formation and the thickness of the channel layer. In short, an In—Ge—Zn—O-based TFT of the present invention has an advantage over an In—Ga—Zn—O-based TFT in terms of cost and mass producibility.

The above-mentioned features are described in detail below with reference to the drawings.

An In—Ge—Zn—O-based material can form a thin film in an amorphous state, which is suitable as a channel material of a TFT, throughout a wide composition range. A composition range in which a film of an In—Ge—Zn—O-based material formed by sputtering assumes an amorphous phase was illustrated in FIG. 57. A crystalline film is obtained in an area enclosed by dashed lines. An amorphous film is obtained in an area surrounded by "a", "b", "c", and "d" excluding the region of intersection between area abcd and the area enclosed by the dashed line. The border between crystalline and amorphous is not firmly set, and affected by film formation conditions, the thickness of the film, and the like. Using an amorphous film is important to build a high performance TFT because, as described above with regard to the ZnO film, crystal size variations and crystal grain boundaries in a polycrystalline film adversely affect TFT characteristics. Having a wider composition range (Zn/In ratio range) in which an amorphous phase is obtained than an In—Ga—Zn—O-based material or an In—Zn—O-based material, an In—Ge—Zn—O-based material is suitable for the channel layer of a TFT.

Effects of containing Ge are described next by comparing an In—Ge—Zn—O-based material with an In—Zn—O-based material. According to Patent Document 1, a Zn/(Zn+In) ratio of 0.3 or more and 0.7 or less is the composition margin (a composition range in which a TFT can operate finely) of an In—Zn—O-based TFT. If the TFT contains 3 at % Ge (in other words, when Ge/(Zn+In+Ge)=0.03), it changes the composition margin to a Zn/(Zn+In+Ge) ratio of 0.80 or less. In short, a small amount of Ge contained in an In—Ge—Zn—O-based TFT makes its composition margin larger than that of a Zn—In—O-based TFT. An In—Ge—Zn—O-based material has a wider composition range in which semiconductor properties are exhibited and an amorphous phase is obtained than a Zn—In—O-based material, and accordingly has a wide composition range in which a TFT can operate.

Preferably a certain appropriate amount or more of Ge is contained in view of stability against environment. Containing Ge (a point t at which the Ge content is approximately equal to 13 at %, a point i at which the Ge content is approximately equal to 3 at %) improves the temporal stability of the resistivity in the atmospheric air, and hence the resistivity hardly temporal changes. In short, adding Ge to a Zn—In—O-based material produces an oxide semiconductor whose resistivity is very stable against environment.

(Composition Range Preferable for an In—Ge—Zn—O-Based Channel)

Described next is a composition range that is preferable when an In—Ge—Zn—O-based material is applied to the channel layer of a TFT.

Figure 57:
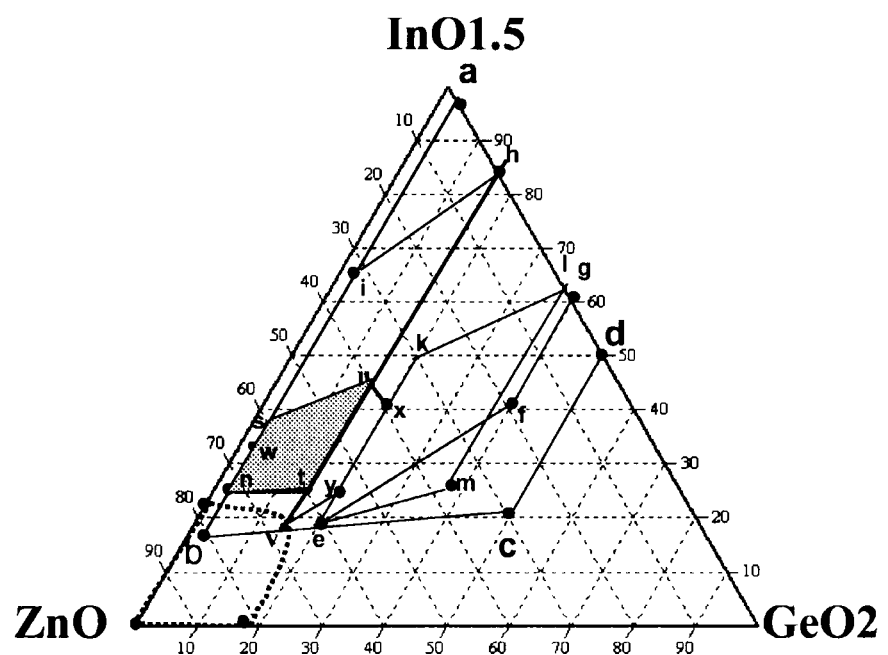
FIG. 57 is a ternary phase diagram illustrating an elemental compositional ratio and its range in an In—Ge—Zn—O-based material.

An element compositional ratio and its range in an In—Ge—Zn—O-based material are described with reference to FIG. 57, which is a ternary phase diagram. In FIG. 57, no particular consideration is paid to the amount of oxygen.

For example, the material may contain trivalent In, tetravalent Ge, and bivalent Zn, and the amount of oxygen contained is equal to or close to the oxygen amount in stoichiometry. A deviation from stoichiometry (e.g., oxygen deficiency) can be controlled by, for example, the oxygen partial pressure in film formation and annealing conditions which are described later.

Point "a" in FIG. 57, for example, indicates that the ratio of the In atom count to the total count of In atoms plus Ge atoms, namely, In/(In+Ge), is 0.97. The ratio of contained In at this point is 97 at %. In FIG. 57, the area to the left of the dashed line is an area where a crystallized In—Ge—Zn—O film is obtained and the area to the right of the dashed line included within the area surrounded by "a", "b", "c", and "d" is an area where an amorphous In—Ge—Zn—O film is obtained.

An extensive study conducted by the present inventors has found that a material that has an In/(In+Ge) compositional ratio larger than 0.97 is crystallized and therefore is undesirable. Also, a material that has an In/(In+Ge) compositional ratio smaller than 0.5 becomes an insulator and thus becomes unsuitable for use as a channel layer.

Patent Document 1 states that an In—Zn—O-based material that has a Zn/(Zn+In) ratio of 70 at % or more is crystallized and therefore is undesirable while an In—Zn—O-based material that has a Zn/(Zn+In) ratio of 30 at % or less forms a film low in resistance and is therefore not suitable as a channel.

Adding 3 at % Ge to Zn—In—O expands a composition range in which an amorphous phase is obtained to an extent where Zn(Zn+In) is approximately equal to 0.8.

The metal element compositional ratio (at %) of each point in FIG. 57 is as follows:
(a) In:Ge:Zn=97:3:0
(b) In:Ge:Zn=17:3:80
(c) In:Ge:Zn=20:50:30
(d) In:Ge:Zn=50:50:0
(e) In:Ge:Zn=18:21:61
(f) In:Ge:Zn=40:40:20
(g) In:Ge:Zn=60:40:0
(h) In:Ge:Zn=84:16:0
(i) In:Ge:Zn=65:3:32
(k) In:Ge:Zn=50:20:30
(l) In:Ge:Zn=62:38:0
(m) In:Ge:Zn=25:38:37
(n) In:Ge:Zn=25:3:72
(w) In:Ge:Zn=33:3:64
(s) In:Ge:Zn=37:3:60
(u) In:Ge:Zn=45:15:40
(v) In:Ge:Zn=18:15:67
(x) In:Ge:Zn=40:20:40
(y) In:Ge:Zn=25:20:55

A composition range enclosed by lines that connect the points "a", "b", "c", and "d" in FIG. 57 is described first. When the composition of an In—Ge—Zn—O thin film is inside the area enclosed by the lines that connect "a", "b", "c", and "d", using this thin film as a channel layer produces an operational transistor (a transistor that has no trouble in executing switching operation). By selecting a thin film that has an arbitrary composition inside this area and forming a channel layer from the selected thin film, a transistor having an on/off current ratio of $10^6$ or more is obtained.

Using a thin film that has a composition in the area surrounded by "a", "b", "e", "f", and "g" in the phase diagram in FIG. 57 creates a transistor that has a small S value (subthreshold swing value) with good reproducibility.

Using a film that has a composition in the vicinity of point "w" (in other words, when Zn/(Zn+In) is 65±5 at %) is preferable because the resultant transistor is large in mobility and on/off current ratio. This composition is also preferable in that a transistor whose threshold voltage is around 0 V can be created.

In a composition range surrounded by "h", "i", "b", "e", "k", and "l" in FIG. 57, a transistor whose threshold voltage has a value close to 0 V is obtained.

In a composition range surrounded by "a", "b", "e", "m", and "l" in FIG. 57, a transistor having a relatively large mobility (≥3 cm$^2$/V-s) is obtained.

In a composition range surrounded by "a", "b", "e", "f", and "g" in FIG. 57, a transistor having a small S value is created with ease.

In a composition range surrounded by "a", "n", "t", and "h" in FIG. 57, a transistor having a large mobility (≥7 cm$^2$/V-s) is created with ease.

Particularly, a normally-off transistor having an on/off current ratio of $10^{10}$ or more and a small S value can be obtained.

In a composition range surrounded by "h", "i", "n", and "t" in FIG. 57, a normally-off transistor having a large mobility (≥7 cm$^2$/V-s), a small S value (≤0.7 V/dec), and a large on/off current ratio all at the same time is obtained.

In a composition range surrounded by "s", "u", "x", "y", "v", and "b" in FIG. 57, a normally-off transistor having a very small S value and a very high mobility is obtained.

In a composition range surrounded by "a", "i", and "h" in FIG. 57, a transistor having a negative threshold is created with ease. A transistor that is relatively large in on current and small in hysteresis can be obtained by choosing an appropriate oxygen partial pressure in film formation. In short, this composition range is effective in creating a normally-on transistor.

In a composition range surrounded by "l", "k", "e", "c", and "d" in FIG. 57, a transistor having a positive threshold is created with ease. Also, a transistor that is relatively small in off current is obtained. A material in this composition range can stably form a thin film that is rather small in mobility but low in carrier concentration. Also, owing to the relatively large Ge content, the material has its optical absorption edge on the short wavelength side and has excellent light transmittance around a wavelength of 400 nm. The refractive index of the material is small. The on current reduces with increasing Ge content in this region. In short, this composition range is effective when small off current and high light transmittance are necessary while the mobility does not need to be so large.

Examples of transfer characteristics are shown in Table 2 and FIGS. 25A to 25E in relation to various compositions of an In—Ge—Zn—O TFT. Plots A, B, C, D, and E in Table 2 correspond to FIGS. 25A, 25B, 25C, 25D, and 25E, respectively. Plots C and D in Table 2 and FIGS. 25C and 25D belong to a shaded area surrounded by "s", "u", "t", and "n" in FIG. 57. The S (V/dec), on/off, Von (V), Vth (V), and μ(cm$^2$/V-s) values of each TFT are organized in the following Table 2:

TABLE 2

Characteristics of In-Ge-Zn-O TFT

| Plot | In:Ge:Zn | S(V/dec) | On/Off | Von(V) | Vth(V) | $\mu_{FE}$(cm$^2$/V-s) |
|------|----------|----------|--------|--------|--------|------------|
| A | 42:13:45 | 0.5 | 1E+11 | −0.3 | 7.5 | 7.28 |
| B | 51:23:26 | 0.6 | 1E+10 | 4.2 | 9.8 | 4.12 |
| C | 32:9:59 | 0.38 | 1E+10 | 4.2 | 11 | 9.8 |
| D | 32:3:65 | 0.26 | 1E+11 | 0.10 | 6 | 15.65 |
| E | 34:36:30 | 0.6 | 1E+10 | 0 | 11 | 4.43 |

First Embodiment

FIG. 1A illustrates a schematic sectional view of a top gate field effect transistor that has an amorphous In—Ge—O channel layer according to this embodiment.

As illustrated in FIG. 1A, an amorphous In—Ge—O oxide film is formed as a channel layer on a glass substrate (Corning 1737, manufactured by Corning Incorporated). The In—Ge—O amorphous oxide film is formed by a high frequency sputtering method in a mixed-gas atmosphere of argon and oxygen inside a sputtering chamber.

Figure 13:
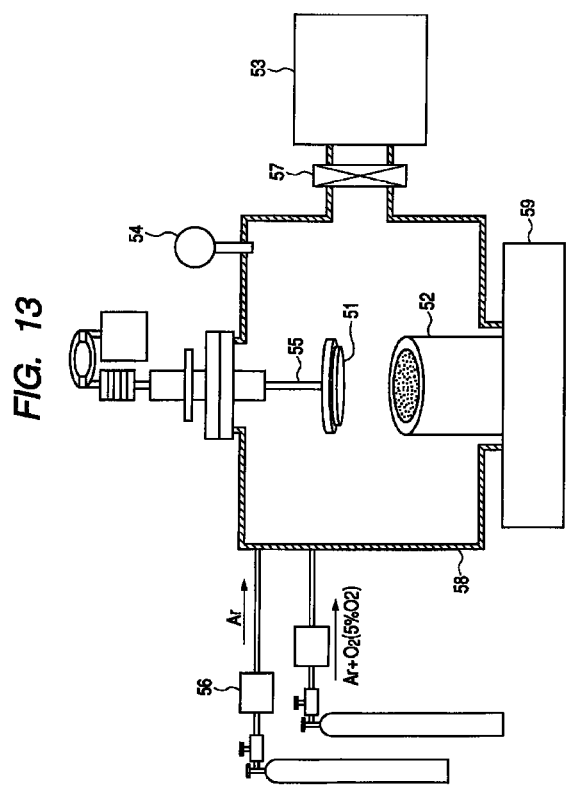
FIG. 13 is a diagram outlining a film formation system that is used to form a film as a channel layer of a field effect transistor according to an embodiment of the present invention.

FIG. 13 is a diagram outlining a film deposition system that is used to form a film as a channel layer of a field effect transistor according to an embodiment of the present invention.

As illustrated in FIG. 13, the film formation system of this embodiment has a gate valve 57 for controlling the vacuum pumping ability and a mass flow controller 56 provided for each gas system in order to control the amount of gas flowing into the gas system. The film formation system also has a vacuum ion gauge 54, a substrate holder 55, a substrate 51, a turbo-molecular pump 53, a deposition chamber 58, and a sputtering gun 52 with a sputtering target.

The turbo-molecular pump 53 is a turbo-molecular vacuum pump that exhausts the deposition chamber 58 until $1 \times 10^{-5}$ Pa (base pressure) is reached.

The substrate holder 55 is capable of adjusting the substrate position in the x- and y-planes and in a vertical direction z.

The sputtering gun 52 has an oxide target 52 (target) on its top surface. In addition to those, the film deposition system has a component that supplies a coolant in order to prevent any damage to the sputtering gun from overheat which takes place during film formation.

The film formation system has a radio frequency (RF) power source and matching network 59 for a sputtering target.

One mass flow controller (MFC) is provided as a gas introduction system for argon gas and diluted oxygen gas (Ar+O2 where Ar:$O_2$=95:5) each.

A predetermined atmosphere (total pressure and oxygen partial pressure) is thus formed in the deposition chamber by controlling the inflow of argon and diluted oxygen gas with the MFCs and by controlling the total pressure with the gate valve.

The In—Ge—O film formed in this embodiment is formed on the glass substrate by simultaneous sputtering of a $GeO_2$ ceramic target having a diameter of 2 inches and two $In_2O_3$ ceramic targets each having a diameter of 2 inches (material source).

A fixed level of RF power was maintained throughout the duration of deposition at 35 W for each $In_2O_3$ target and 30 W for the $GeO_2$ target.

The total gas pressure and the Ar:$O_2$ flow rate ratio during deposition are 0.4 Pa and 69:1, respectively. The deposition rate is 11 nm/min. The substrate temperature was kept at room temperature (25° C. or lower).

Figure 14:
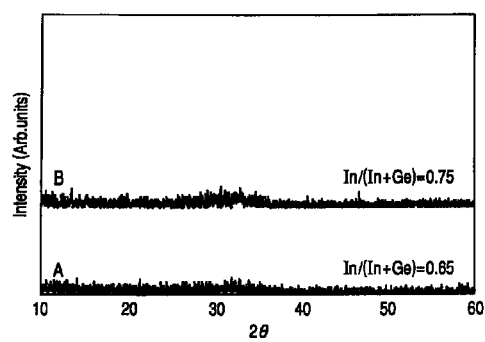
FIG. 14 is a graph illustrating X-ray diffraction pattern examples of an annealed oxide channel layer that has an In/(In+Ge) ratio of 0.65 and 0.75.

FIG. 14 is a graph illustrating X-ray diffraction pattern examples of an annealed oxide channel layer that has an In/(In+Ge) ratio of 0.65 and 0.75.

According to the X-ray diffraction patterns (thin-film XRD, incident angle: 0.5°) of this film which are illustrated in FIG. 14, no diffraction peak has been observed for a composition expressed as In/(In+Ge)=0.65. An In—Ge—O film of this composition accordingly has an amorphous structure.

The thickness of the film is 25 nm. The root mean square (rms) surface roughness estimated from a measurement value of spectroscopic ellipsometry is about 0.1 nm.

A fluorescent X-ray analysis (XRF) has found that the In/(In+Ge) metal compositional ratio of the thin film is 0.65.

The specific resistivity of the film is approximately $10^5$ Ω·cm.

The electron carrier density is estimated to be $1 \times 10^{14}$/cm$^3$.

Figure 15:
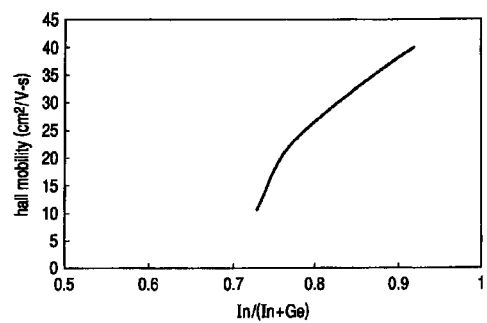
FIG. 15 is a graph illustrating an example of a hole mobility $\mu_{hole}$ (cm$^2$/Vsec) as a function of In/(In+Ge).

FIG. 15 is a graph illustrating an example of a hole mobility $\mu_{hole}$ (cm$^2$/V s) as a function of In/(In+Ge).

A hole measurement of an oxide film formed in a pure argon atmosphere was conducted. The mobility clearly rose as the ratio of contained In increased. When In/(In+Ge)~0.95 is satisfied, a very high mobility is accomplished at 40 cm$^2$/Vsec.

Next, a photolithography patterning method and a lift-off method were employed to form the drain electrode 14 and the source electrode 13 into a pattern. The source and the drain are each a layered structure formed of a 40 nm-thick Au layer and a 5 nm-thick Ti layer.

An $SiO_2$ dielectric material was formed as a gate insulator by a sputtering method to a thickness of 150 nm. The relative dielectric constant of the $SiO_2$ film is about 3.7.

The gate electrode 15 was also formed by patterning with the use of standard photolithography method and lift-off method. The width and length of the channel are 200 μm and 50 μm, respectively.

(Evaluation of TFT Device Characteristics)

FIG. 11 is a graph illustrating an example of the current-voltage characteristics of a TFT having an In/(In+Ge) ratio of 0.65 which are measured at room temperature.

A constant gate voltage ($V_G$) was applied while measuring the dependency of the drain voltage $V_D$ on the drain current $I_D$ between the source electrode and the drain electrode. As a result, a typical semiconductor transistor behavior was observed in which saturation (pinch-off) was reached at a drain voltage $V_D$ of about 6 V.

With $V_D$ set to 6 V, $V_G$ is changed in 0.1 V increments from −20 V to 20 V in order to evaluate the TFT transfer characteristics log($I_D$) versus $V_u$. A threshold gate voltage (Vth) of 3.5 V is obtained as a result.

The source-drain current $I_D$ was measured to be $5 \times 10^{-4}$ A at a gate voltage $V_G$ of 20 V.

FIG. 12 is a graph illustrating an example of the transfer characteristics log($I_D$) versus $V_G$ of a TFT that has an amorphous In—Ge—O channel layer having a composition expressed as In/(In+Ge)=0.65.

The on/off current ratio of the transistor was $10^{10}$ or more. From output characteristics, the field effect mobility $\mu_{FE}$ is calculated to be 3.4 cm$^2$/V s in the saturation region of the TFT.

Fine switching performance of normally-off TFT characteristics including a threshold voltage Vth of 3.5 V and as small a subthreshold swing value S as 0.4 V/dec is obtained.

Further, when two or more TFTs are manufactured under the same process conditions, this embodiment was successful in reproducing the same TFT characteristics.

In short, this embodiment succeeded in obtaining excellent transistor characteristics by applying a new amorphous oxide semiconductor, In—Ge—O, to the channel layer of a TFT.

This is noteworthy since excellent TFT characteristics are obtained by using an oxide that is formed of fewer metal elements than an In—Ga—Zn—O-based oxide.

Moreover, using Ge which is a relatively inexpensive element in an oxide helps to reduce the material cost. In addition, this material is expected to have little effect on environment.

An In—Ge—O channel layer thin film transistor of the present invention keeps the material cost low and exhibits fine TFT performance, and hence using this transistor in an operation circuit of an OLED is promising.

Second Embodiment

This embodiment is an example of studying the material composition dependency of a channel layer.

In order to examine the material composition dependency, a combinatorial method is employed for deposition. Specifically, the examination has been made with the use of a method in which an oxide thin film varied in composition is formed on a single substrate at once by a sputtering method.

However, this method does not always need to be employed. Material sources (targets) of a given composition may be prepared for deposition, or a thin film of desired compositions may be formed by controlling the input power applied to each of multiple targets.

An oxide thin film in which a composition distribution is observed has been formed on a substrate by a combinatorial sputtering method. Through a device fabrication process, TFTs that have various channel compositions were fabricated on the substrate at once. The TFTs were subsequently evaluated and compared.

An In—Ge—O film was formed by deposition through sputtering with the use of three sputtering devices, which are at an angle with respect to the substrate surface. The composition of the film on the substrate is varied depending on the distance between a target and a given point on the substrate and the angle.

A thin film that is uniform in thickness but has a wide composition distribution can thus be obtained on a 3 inch-diameter substrate.

A $GeO_2$ target and two $In_2O_3$ targets each having a diameter of 2 inches are sputtered simultaneously to form an In—Ge—O thin film channel. The RF power applied to the $In_2O_3$ targets and to the $GeO_2$ target is kept constant at 35 W and 30 W, respectively.

The partial $O_2$ pressure during deposition was controlled with precision by using 5% $O_2$ gas that was diluted by Ar. The total pressure is 0.45 Pa and Ar:$O_2$ is 69:1. The substrate temperature has been kept at 25° C.

While the physical properties of the thin film were evaluated by fluorescent X-ray analysis, spectroscopic ellipsometry, and X-ray diffraction (XRD), the thin film was measured electrically by four-point probe resistivity measurement and hole mobility measurement.

A bottom gate, top contact TFT having the In—Ge—O film formed by a combinatorial method as an n-type amorphous oxide channel layer was fabricated, and TFT characteristics were evaluated at room temperature.

A measurement by spectroscopic ellipsometry has found that the thin film has a thickness of 25 nm and a thickness distribution within ±10%.

In the case of a film that has an In/(In+Ge) compositional ratio of 0.5 or more and 0.97 or less, no diffraction peak is found in an X-ray diffraction pattern (thin-film XRD, incident angle: 0.5°) of the just formed film.

Therefore, an In—Ge—O film immediately after formation has an amorphous structure in this composition range. The film is then annealed at 300° C. in air for one hour. In the case of an In/(In+Ge) compositional ratio of 0.5 or more and 0.9 or less, no diffraction peak is found in an X-ray diffraction pattern of the annealed film.

The annealed In—Ge—O film therefore has an amorphous structure in this composition range. A plot A and a plot B of FIG. 14 represent diffraction pattern examples of the annealed film at an In/(In+Ge) compositional ratio of 0.65 and 0.75, respectively. When In/(In+Ge) exceeds 0.9, the film assumes a polycrystalline structure and a diffraction peak is observed.

The specific resistivity of an In—Ge—O thin film and the composition dependency of the specific resistivity are described next.

FIG. 5 is a graph illustrating results of obtaining the composition dependency of a sheet resistance $R_S$ of an In—Ge—O film with the use of a sheet resistivity measuring system using a four-point probe method.

The thickness of the film was measured by spectroscopic ellipsometry, and the specific resistivity of the film was calculated from the measured values of the thickness and the sheet resistance $R_S$. A change in specific resistivity $\rho$ caused by a change in In—Ge compositional ratio was checked.

As illustrated in FIG. 5, the specific resistivity of the film increases as the composition shifts from an In-rich composition region to a Ge-rich composition region.

Specifically, as illustrated in FIG. 5, the film changes from a conductor (smaller than $10^{-1}$ Ω·cm) to a semiconductor (between $10^{-1}$ Ω·cm and $10^6$ Ω·cm), and from a semiconductor to an insulator (larger than $10^7$ Ω·cm). (In this specification a resistivity value larger than or equal to $10^7$ Ω·cm is considered insulating.)

A TFT operates very well in an In/(In+Ge) composition range of 0.5 or more and 0.97 or less, namely, a composition range in which a semiconductor behavior is observed.

It is found that there is a correlation between the plot shape and TFT performance.

A $\rho$ versus compositional ratio plot of FIG. 5 has four gradients in the semiconductor region. The resistivity for composition expressed as $0.97 \leq In/(In+Ge) \geq 0.5$ can be expressed by four regions in FIG. 6 as follows:

The gradient in region 1 corresponds to 0.1 Ω·cm$\leq \Sigma \leq$1 Ω·cm, $0.9 < In/(In+Ge) \leq 0.97$.

The gradient in region 2 corresponds to 1 Ω·cm$\leq \rho \leq 10^3$ Ω·cm, $0.75 < In/(In+Ge) \leq 0.9$.

The gradient in region 3 approximately corresponds to $10^3$ Ω·cm$\leq \rho \leq 10^4$ Ω·cm, $0.65 < In/(In+Ge) \leq 0.75$.

The gradient in region 4 corresponds to $10^4$ Ω·cm$\leq \rho \leq 10^7$Ω·cm, $0.5 \leq In/(In+Ge) \leq 0.65$.

This disposition is closely related to TFT performance. TFT characteristics related to the composition and the specific resistivity in region 1 are illustrated as plot E of FIG. 10.

Similarly TFT characteristics related to the composition and the specific resistivity in region 2 are illustrated as plots D and C of FIG. 10.

When the regions of FIG. 5 are examined in order from region 1 to region 4, it is clear that the TFT parameters S, Vth, and on/off current ratio are markedly improved.

However, from region 1 (In-rich composition range) to region 4 (Ge-rich composition range), the specific resistivity increases and the carrier concentration is lowered, which reduces the mobility.

Extremely fine TFT characteristics are therefore obtained at compositions corresponding to region 3 and region 4.

Figure 16:
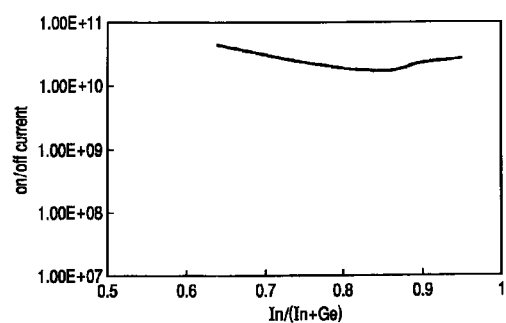
FIG. 16 is a graph illustrating an example of the on/off current ratio as a function of In/(In+Ge) atomic ratio.

A more detailed study reveals that a TFT corresponding to region 4 (S=0.4) has the best S value (FIG. 16) and the highest drive stability (FIG. 8). FIG. 16 is a graph illustrating an example of the on/off current ratio as a function of the In/(In+Ge) atomic ratio.

The mobility in region 4 (=3.4 $cm^2$/Vsec), however, is lower than the mobility in region 3 (=6 $cm^2$/Vsec). Region 3 and region 4 are both composition ranges preferable for a TFT channel.

FIG. 9 is a graph illustrating a change in specific resistivity of an In—Ge—O film due to the partial $O_2$ pressure. The graph's two plots correspond to an In/(In+Ge) compositional ratio of 0.65 and 0.75, respectively.

It can be seen from the graph that the specific resistivity of a film having a given composition increases as the oxygen partial pressure rises.

This can be associated with the fact that a rise in oxygen partial pressure decreases oxygen vacancies.

It is also observed that a specific resistivity range suitable for TFT use can be adjusted by adjusting the oxygen partial pressure.

FIG. 7 is a graph illustrating results of measuring a temporal change of the specific resistivity of an In—Ge—O film that has an In/(In+Ge) ratio of approximately equal to 0.65. The In—Ge—O thin film was examined over a wide composition range.

It was observed that the specific resistivity of the In—Ge—O thin film immediately after film formation initially declines with time for the first 300 hours (1.5 weeks) or so after film formation, but ultimately becomes steady.

The specific resistivity of the film becomes steady at a faster rate when the film is annealed in the air. In a Ge-rich composition range (0.5≥Ge/(Ge+In)≥0.25), the final steadied specific resistivity is appropriate for TFT use ($10^5$ $\Omega \cdot cm \geq \rho \geq 10^3$ $\Omega \cdot cm$). This explains the excellent stability of TFT characteristics in a high-Ge content region.

A bottom gate thin film transistor that has a structure illustrated in FIG. 1C was fabricated next.

First, an In—Ge—O composition gradient film was formed by combinatorial sputtering on an $n^+$-Si substrate where a thermally oxidized $SiO_2$ layer was formed to a thickness of 100 nm.

A bilayer of a 100 nm-thick Au layer and a 5 nm-thick Ti layer was formed as a source electrode and a drain electrode by patterning with the use of photolithography patterning and lift-off.

In this manner, a thin film containing a large number of TFTs which have active layers of various compositions was obtained on a 3-inch-diameter substrate. The highest process temperature is 120° C. The $SiO_2$ layer serves as a gate insulator and $n^+$-Si acts as a gate electrode.

TFT characteristics and TFT stability are evaluated next.

In FIG. 1C, the gate electrode 21 is formed from the gate insulator 22 is formed from $SiO_2$, the source electrode 23 and the drain electrode 24 are formed from Au/Ti, and the active layer 25 is formed from In—Ge-0.

The width and length of the channel are 150 μm and 10 μm, respectively. The transfer characteristics of the TFT are obtained with the drain voltage $V_D$ set to 6 V.

The on/off current ratio was obtained from the ratio of the maximum drain current value to the minimum drain current value. The field effect mobility was calculated from the slope of a $\sqrt{I_D}$ ($I_D$: drain current) versus gate voltage ($V_G$) graph.

The threshold voltage Vth was obtained from x-axis intercepts of the graph of $\sqrt{I_D}$ versus $V_G$. The minimum value of a $dV_G/d$ ($logI_D$) graph was employed as the S value (namely, the value of the voltage $V_G$ that is necessary to increase the current by one digit).

FIG. 6 is a graph illustrating the composition dependency of the transfer characteristics ($log(I_D)$ versus $V_G$) of a field effect transistor (FET) that has an n-type In—Ge—O channel layer.

Variations in TFT characteristics depending on the In—Ge compositional ratio were obtained as illustrated in FIG. 6 by evaluating TFT characteristics at various points on the substrate. It can be seen from the graph that the TFT characteristics change as the location on the substrate changes, in other words, as the In:Ge compositional ratio changes.

FIG. 6 illustrates the $log(I_D)$–$V_G$ characteristics of the TFT varied in composition (not annealed).

In a Ge-rich composition region (for example, regions A and B), a small positive threshold voltage, a small off-current, and a large on-current were obtained.

Normally-off TFT characteristics are thus obtained.

In an In-rich composition region (for example, plots D and E), on the other hand, a very large off-current was obtained.

Because of the very large off-current, the on/off ratio of the TFT in an In/(In+Ge) compositional range of 0.85 or more and 0.9 or less is on the order of $10^1$, which is very small.

As is evident in plots D and E of FIG. 6, the threshold voltage takes a more negative value as the ratio of contained In increases. This can be due to the high conductivity (i.e., many carriers) of the In-rich composition region. Therefore, a more negative threshold voltage (Vth) was obtained.

In an In/(In+Ge) composition range of 0.5 or more and 0.85 or less, relatively excellent characteristics of on/off current ratio>$10^9$ were obtained.

An increase in field effect mobility $\mu_{FE}$, which follows a rise in the ratio of contained In, increases the S value. While a high mobility is desirable for fine switching frequency, attention must be paid to the fact that the S value determines the switching performance for switching from off to on.

A small positive S value is therefore very desirable. However, in some cases, the mobility is varied depending on the desired use. For example, for use in an active matrix organic light emitting diode (AMOLED), a mobility of 1 $cm^2/Vsec$ or more is desirable.

The following Tables 3, 4, and 5 each show a list of S, Vth, and μ values of a TFT immediately after film formation and an annealed TFT as a function of the compositional ratio.

TABLE 3

| In/(In + Ge) | 0.65 | 0.75 | 0.85 | 0.90 | 0.95 |
|---|---|---|---|---|---|
| S(V/dec) Right after film formation | 0.88 | 1.2 | 1.4 | — | — |
| S(V/dec) After annealing | 0.4 | 0.55 | 0.97 | 1.2 | — |

TABLE 4

| In/(In + Ge) | 0.65 | 0.75 | 0.85 | 0.90 | 0.95 |
|---|---|---|---|---|---|
| Vth(V) Right after film formation | 0 | −4 | −9 | — | — |
| Vth(V) After annealing | 3.5 | 0 | −4 | −11 | — |

TABLE 5

| In/(In + Ge) | 0.65 | 0.75 | 0.85 | 0.90 | 0.95 |
|---|---|---|---|---|---|
| $\mu_{FE}$($cm^2$/V-s) Right after film formation | 2.8 | 6 | 7 | 11 | — |
| $\mu_{FE}$($cm^2$/V-s) After annealing | 3.4 | 6 | 10 | 14.5 | 17 |

To summarize, an In—Ge—O channel layer TFT immediately after film formation within an In/(In+Ge) composition margin of 0.6 or more and 0.75 or less can have excellent TFT characteristics as follows:

On/off ratio>$10^9$

Drain saturation current $I_D$>$10^4$ A

Vth>0 (small positive value)

Mobility: 3 $cm^2/Vsec \leq \mu \leq 6$ $cm^2/Vsec$

When the same TFT is annealed at 300° C. in the air, the TFT characteristics are further improved.

FIG. 10 illustrates the transfer characteristics ($log(I_D)$ versus $V_G$) of an annealed TFT.

TFT characteristics as a function of the composition have a disposition similar to that of TFT characteristics prior to annealing. However, a comparison to a TFT immediately after film formation reveals an obvious change in absolute value of TFT characteristics, particularly in the In-rich composition region.

Illustrated in FIG. 10 is an example of the composition dependency of TFT characteristics after annealing.

A comparison of plots D and E of FIG. 10 with plots D and E of FIG. 6 clearly illustrates that the TFT characteristics are improved by annealing.

It is also obvious from the comparison that a composition range in which fine TFT characteristics are exhibited is even wider. For instance, plots (B), (C), and (D) which are of an In/(In+Ge) compositional ratio of 0.65, an In/(In+Ge) compositional ratio of 0.75, and an In/(In+Ge) compositional ratio of 0.85, respectively, indicate fine TFT characteristics.

In a Ge-rich composition region (for example, regions A and B), a small positive threshold voltage Vth as well as a small off-current and a large on/off current ratio are obtained, in other words, normally-off TFT characteristics are obtained. The S value in this composition region is very small (0.4≤S≤0.55), which gives the excellent TFT switching performance.

The off-current in a Ge-rich composition region (for example, regions A and B) is rather small, and the on/off current ratio in a Ge-rich composition region is therefore large.

The In:Ge composition dependency of the field effect mobility $\mu_{FE}$ of an annealed TFT is illustrated in FIG. 2. It can be seen from FIG. 2 that $\mu_{FE}$ increases as the ratio of contained In rises.

When the ratio of contained In is 0.97 or less and 0.65 or more, $\mu_{FE}$ equal to or less than 17 cm$^2$/Vsec and equal to or more than 3.4 cm$^2$/Vsec is obtained in a composition range expressed by In/(In+Ge).

FIG. 3 illustrates the composition dependency of the threshold voltage. Creating a circuit is easy when the threshold voltage (Vth) of a thin film transistor is 0 V or higher. As illustrated in FIG. 3, Vth is positive when In/(In+Ge) is 0.75 or less, which is an obviously desirable characteristic.

FIG. 4 illustrates an example of the composition dependency of the S value. It is understood from FIG. 4 that an In/(In+Ge) compositional ratio of 0.5 or more and 0.75 or less is desirable. This is because, in this range, a small S value between 0.4 and 0.55 is attained. The small S value gives a TFT clearly excellent switching (from off to on) performance.

In the case of a TFT illustrated in FIG. 10 that has an In/(In+Ge) ratio of 0.55 (FIG. 10, plot A), the field effect mobility value is 3.4 cm$^2$N s, the on/off current ratio is 4.5×10$^{10}$, the turn-on voltage is −1.9 V, the threshold voltage is 3.5 V, and the S value is 0.4 V/dec.

In the case of a TFT that has an In/(In+Ge) ratio of 0.75 (FIG. 10, plot B), the field effect mobility value is 6.0 cm$^2$ (Vsec), the on/off current ratio is 2.0×10$^{10}$, the turn-on voltage is −5.0 V, the threshold voltage is 0 V, and the S value is 0.55 V/dec.

In order to research the merit of an In—Ge—O-based material over other amorphous oxide semiconductors, the present inventors manufactured TFTs with care that have similar compositions but different oxides as their channel layers.

For this purpose, In—Mg—O TFTs, In—Al—O TFTs, and In—Ga—O TFTs were fabricated, and their TFT characteristics were compared.

The present inventors examined the In—Mg—O, In—Al—O, and In—Ga—O TFTs in the same way as the In—Ge—O-based TFTs, thereby obtaining composition dependency results. For each of the In—X—O-based oxides, a TFT exhibiting fine characteristics was extracted and the extracted TFTs were compared with a TFT that contains an In—Ge—O-based oxide.

Figure 17:
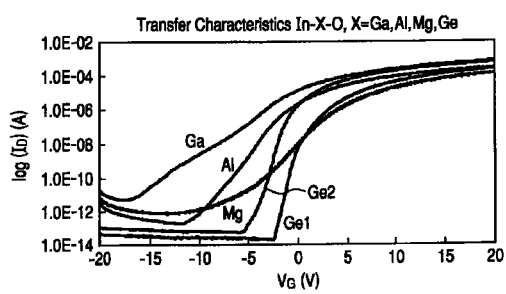
FIG. 17 is a graph illustrating, for each of those oxide materials, an example of transfer characteristics (log($I_D$) versus $V_G$) of a TFT.

FIG. 17 is a graph illustrating, for each of those oxide materials, an example of the transfer characteristics (log($I_D$) versus $V_D$) of a TFT that is based on the oxide material. In FIG. 17, Ge1 and Ge$_t$ represent a TFT that has a Ge/(Ge+In) compositional ratio of 0.35 and a TFT that has a Ge/(Ge+In) compositional ratio of 0.25, respectively.

The characteristics of the In—Ge—O TFT are clearly superior to any of the In—X—O(X=Ga, Al, or Mg) TFTs. X represents the second metal element in the two-metal element oxide-based material in which the first metal element is indium.

Figure 18:
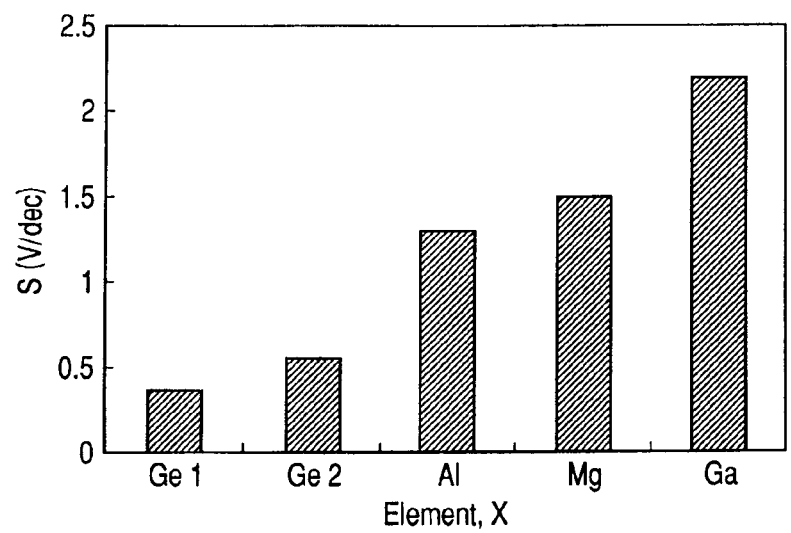
FIG. 18 is a graph illustrating an example of comparing subthreshold swing values of TFTs that contain an In—Ga—O-based oxide, an In—Al—O-based oxide, and an In—Mg—O-based oxide against subthreshold swing values of TFTs that contain In—Ge—O-based oxides of the present invention.

FIG. 18 is a graph illustrating an example of comparing sub-threshold swing values of TFTs that contain an In—Ga—O-based oxide, an In—Al—O-based oxide, and an In—Mg—O-based oxide against sub-threshold swing values of TFTs that contain In—Ge—O-based oxides of the present invention. In FIG. 18, the sub-threshold swing value is denoted by S (V/dec).

Figure 19:
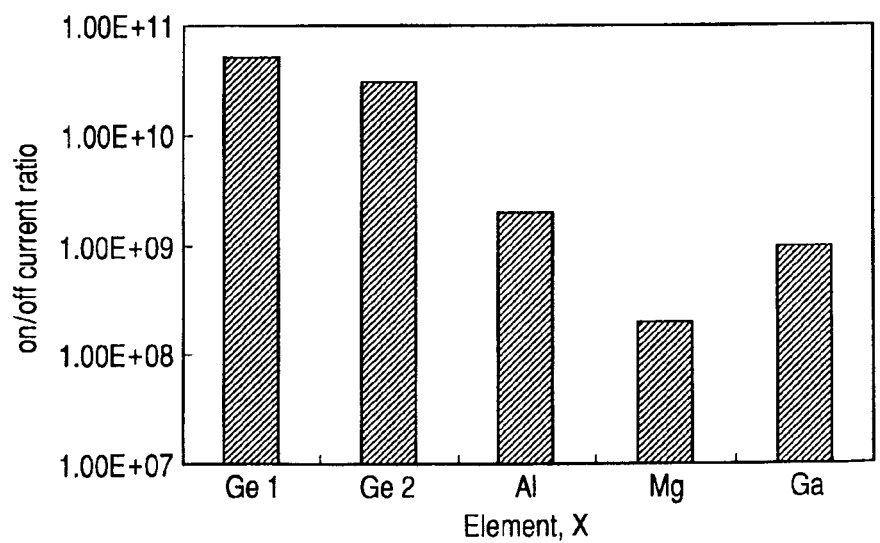
FIG. 19 is a graph illustrating an example of comparing on/off current ratios of TFTs that contain an In—Ga—O-based oxide, an In—Al—O-based oxide, and an In—Mg—O-based oxide against on/off current ratios of TFTs that contain In—Ge—O-based oxides of the present invention.

FIG. 19 is a graph illustrating an example of comparing on/off current ratios of TFTs that contain an In—Ga—O-based oxide, an In—Al—O-based oxide, and an In—Mg—O-based oxide against on/off current ratios of TFTs that contain In—Ge—O-based oxides of the present invention.

Figure 20:
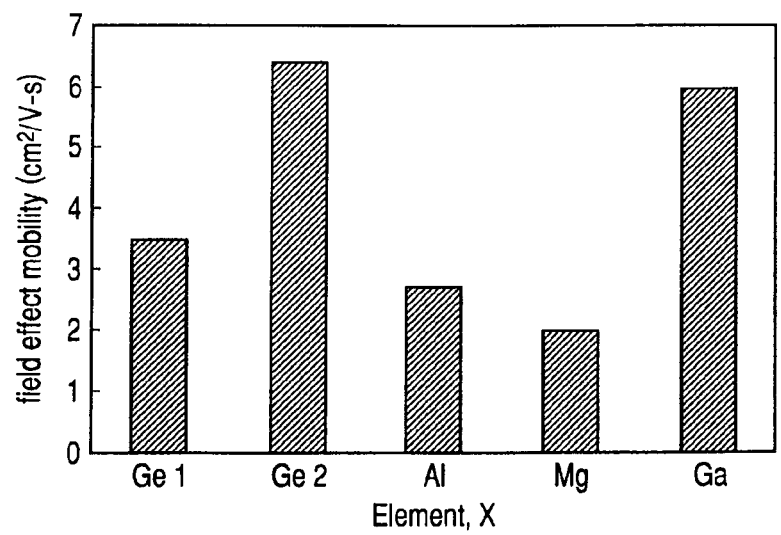
FIG. 20 is a graph illustrating an example of comparing field effect mobilities of TFTs that contain an In—Ga—O-based oxide, an In—Al—O-based oxide, and an In—Mg—O-based oxide against field effect mobilities of TFTs that contain In—Ge—O-based oxides of the present invention.

FIG. 20 is a graph illustrating an example of comparing field effect mobilities of TFTs that contain channel layers with an In—Ga—O-based oxide, an In—Al—O-based oxide, and an In—Mg—O-based oxide against field effect mobilities of TFTs that contain In—Ge—O-based oxide channel layer of the present invention.

As illustrated in FIGS. 18, 19, and 20, the superior TFT characteristics of the In—Ge—O TFT are made more obvious through the comparison of TFT characteristics in terms of S (V/dec), on/off, and $\mu_{FE}$ (cm$^2$/V s).

In the In—Ge—O TFT, a smaller S value, a better $\mu_{FE}$, and a higher on/off ratio are obtained than in other In—X—O TFTs illustrated in FIGS. 18 to 20.

The In—Ge—O TFT probably owes its small S value to a favorable interface easily formed between the In—Ge—O oxide semiconductor and a silicon oxide gate insulator.

Further, attention must be paid to the fact that the In—Ge—O-based TFT can operate in a much wider compositional ratio region than the In—Zn—O-based TFTs. A composition range in which the In—Ge—O TFT can operate and a composition range in which an In—Zn—O TFT can operate are found out from the following Table 6.

TABLE 6

| In-X-O | Composition range that allows TFT operation |
|---|---|
| In-Zn-O | 0.3 < In/(In + Zn) < 0.5 |
| In-Ge-O | 0.5 < In/(In + Ge) < 0.97 |

A TFT containing an In—Ge—O-based oxide is also resistant to drive stress. Further, a TFT containing an In—Ge—O-based oxide has fine temporal stability.

FIG. 8 illustrates the transfer characteristics of a just fabricated TFT and the transfer characteristics of the TFT one month after the fabrication. FIG. 8 corresponds to an In/(In+Ge) channel composition of 0.65. It can be seen from FIG. 8 that the change in characteristics is small.

Third Embodiment

This embodiment is an example of using an amorphous In—Ge—O oxide semiconductor as a channel layer on a plastic substrate.

A structural example of a thin film transistor of this embodiment is illustrated in FIG. 1B. The length of the channel is 60 μm, and the width of the channel is 180 μm. The substrate 10 is a polyethylene terephthalate (PET) film.

First, the gate electrode 15 and the gate insulation layer 12 are formed by patterning on the substrate 10 with the use of the photolithography patterning method and the lift-off method.

The gate electrode 15 is a Ta layer having a thickness of 50 nm. The gate insulation layer is an $SiO_xN_y$ film formed by sputtering to a thickness of 150 nm. The dielectric constant of the $SiO_xN_y$ film is about 6.

Next, the channel layer of the transistor was formed by sputtering and shaped by photolithography patterning and lift-off.

The channel layer 11 is made of an In—Zn—Ge—O-based amorphous oxide and has a composition expressed as In:Zn:Ge=1.4:2.1:1.

The amorphous oxide In—Zn—Ge film described above was formed by the RF sputtering method in an atmosphere of argon gas and oxygen gas.

Three targets (material sources) in this embodiment were sputtered simultaneously. For this purpose, three sintered, small-sized (2 inches in diameter) targets of $In_2O_3$, $GeO_2$, and ZnO are used.

The In—Zn—Ge oxide thin film can be controlled to have a desired In:Zn:Ge composition value by controlling the RF power applied to each target. The partial $O_2$ pressure was controlled with precision by fixing the total deposition pressure to 0.46 Pa, using 5% $O_2$ gas that was diluted with Ar, and setting $Ar:O_2$ to 69:1. The substrate temperature is kept at room temperature (25° C. or lower).

No diffraction peak is observed in diffraction patterns (thin-film XRD, incident angle: 0.5°) of the oxide film immediately after film formation and after annealing. The oxide film is therefore amorphous. The thickness of the amorphous oxide film is approximately 25 nm.

The amorphous oxide film has an absorption edge energy larger than 3 eV and, as can be seen from the optical absorption spectrum, has significantly high transparency in the visible light range and near-infrared light range of the electromagnetic spectrum.

The source electrode, the drain electrode, and the gate electrode are made of an indium tin oxide, which is considered to be a transparent conductive oxide. The thickness of the indium tin oxide layer is 100 nm.

(Evaluation of TFT Device Characteristics)

The characteristics of the TFT on the PET substrate are measured under a room temperature condition. The on/off ratio of the transistor is $10^{10}$ or higher. The electron field effect mobility $\mu_{FE}$ of the transistor was calculated to be 3 $cm^2$ (Vsec).

The thin film transistor having the In—Zn—Ge channel layer of this embodiment also possesses high performance and high stability against environment.

Fourth Embodiment

In—Ge—Zn—O TFT

This embodiment is an example of a field effect transistor that uses amorphous In—Ge—Zn—O for its channel layer and that has a top gate structure illustrated in section in FIG. 1A.

As illustrated in FIG. 1A, a film of an amorphous In—Ge—Zn—O oxide is formed as the channel layer on a glass substrate (Corning 1737, a product of Corning Incorporated). The amorphous In—Ge—Zn—O oxide film is formed by the RF sputtering method in a mixed-gas atmosphere of argon and oxygen. Employed film formation apparatus is as the one illustrated in FIG. 13.

In this embodiment, the In—Ge—Zn—O film was formed on the glass substrate by simultaneous sputtering of three 2-inch size ceramic targets (ZnO, $GeO_2$, and $In_2O_3$). The applied RF power is kept constant for the duration of deposition at a power of 45 W for ZnO, 30 W for $GeO_2$, and 35 W for $In_2O_3$. The total pressure during deposition is 0.46 Pa, the $Ar:O_2$ flow rate ratio is 69:1. The deposition rate is 11 nm/min. The substrate is not heated during deposition and, accordingly, the substrate temperature is substantially kept at room temperature.

As illustrated in FIG. 26, the thin film having the In:Ge:Zn compositional ratio approximately equal to 42:13:45 has no diffraction peaks in its X-ray diffraction pattern, and is amorphous.

The film was 25 nm in thickness and had a surface roughness of about 0.1 nm according to an evaluation by ellipsometry. The fluorescent X-ray analysis found that the In:Ge:Zn compositional ratio was 42:13:45. The resistivity was $10^5$ Ω·cm, and the electron carrier concentration was estimated to be $1×10^{14}/cm^3$.

The drain electrode 14 and the source electrode 13 are formed next by patterning through lithography and lift-off. The source and the drain are electrodes formed from a laminate of 40 nm-thick Au layer and a 5 nm-thick Ti layer. An $SiO_2$ film is formed as a gate insulation layer by a sputtering method to a thickness of 100 nm. The dielectric constant of the $SiO_2$ film is about 3.7. The gate electrode 15 was subsequently formed by patterning. The channel width and the channel length are 200 μm and 50 μm, respectively.

(Evaluation of TFT Characteristics)

FIG. 24B illustrates an example of the electric characteristics of an In—Ge—Zn—O TFT having an In—Ge—Zn—O channel having the Zn:In:Ge compositional ratio approximately equal to 45:13:42. The measurement was conducted at room temperature. As illustrated in FIG. 24B, a typical semiconductor transistor behavior was observed. The drain current was measured while keeping the gate voltage constant and varying the drain voltage. As a result, current saturation (pinch-off) was observed at a drain voltage $V_D$ of about 6 V. With $V_D$ set to 6 V, $V_G$ was varied from −30 V to 30 V in order to evaluate the TFT transfer characteristics $\log(I_D)$ versus $V_G$. The source-drain current $I_D$ at a $V_G$ of 25 V was $5×10^{-4}$ A. The on/off current ratio was on the order of $10^{11}$. From transfer characteristics, the field effect mobility $\mu_{FE}$ was calculated to be 7.00 $cm^2/(V·s)$ in the saturation region. Fine normally-off TFT characteristics were exhibited, including a turn-on voltage Von of −0.3 V and a threshold voltage Vth of 7.5 V. The S value is 0.5 V/dec.

A TFT was manufactured by way of trial under the same process conditions twice or more, and the same TFT characteristics were successfully reproduced.

In short, fine transistor characteristics were accomplished by employing a new amorphous oxide, In—Ge—Zn—O, in the channel layer. No definite reason is found for why the transistor of fine characteristics can be fabricated with good reproducibility, but it is probably because of the stability in vacuum and various kinds of oxygen atmosphere, and small fluctuation in characteristics with respect to the channel film thickness.

Figure 28A:
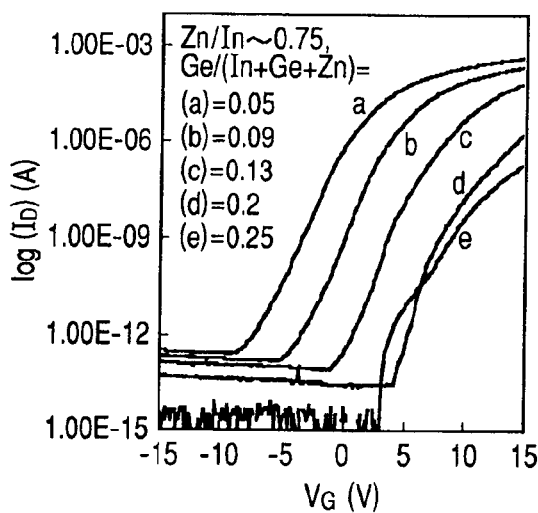
FIGS. 28A and 28B are graphs comparing transfer characteristics of an In—Ge—Zn—O-based TFT and transfer characteristics of an In—Ga—Zn—O-based TFT, with FIG. 28A illustrating data at a fixed Zn/In ratio and at a varied Ge content of In—Ge—Zn—O, and FIG. 28B illustrating data at a fixed Zn/In ratio and at a varied Ga content of In—Ga—Zn—O.
Figure 28B:
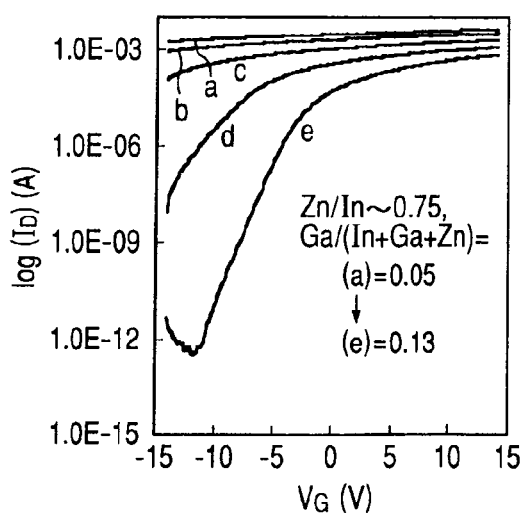

FIGS. 27A and 27B and FIGS. 28A and 28B are diagrams illustrating a comparison between an In—Zn—Ge—O-based TFT and an In—Zn—Ga—O-based TFT. FIGS. 27A and 27B illustrate the behavior of transfer characteristics in relation to various Zn/In compositional ratios. The Ge content of the In—Zn—Ge—O based TFT in FIG. 27A is fixed at 9 (at %). In other words, Ge/(Ge+Zn+In) is approximately equal to 0.09. The Ga content of the In—Zn—Ga—O-based TFT in FIG. 27B is fixed at 9 (at %). In other words, Ga/(Ga+Zn+In) is approximately equal to 0.09. FIGS. 28A and 28B illustrate the behavior of transfer characteristics in relation to various Ge (or Ga) contents. The Zn/In ratio of the In—Zn—Ge—O-based TFT in FIG. 28A is fixed at 0.75 or so. The Zn/In ratio of the In—Zn—Ga—O-based TFT in FIG. 28B is fixed at 0.75 or so. The compositions of transfer characteristics a, b, c, d, and e in FIG. 28A correspond to compositions at 1D, 2D, 3D, 4D, and 5D of FIG. 29, which is a ternary phase diagram.

In an In—Zn—Ge—O-based TFT, the carrier density is low and switching-off can be executed when the Ge content is 3 at % or more (for example, Ge/(Ge+Zn+In)=0.05 and Zn/In=0.75). On the other hand, with reference to FIG. 28B an In—Zn—Ga—O-based TFT with 5 at % or less Ga content is not enough to lower the carrier concentration and to switch off. In short, an In—Zn—Ga—O-based TFT cannot switch off at a Ga/(Ga+Zn+In) ratio of 0.05 and a Zn/In ratio of 0.75.

This is a noteworthy advantage of an In—Ge—Zn—O-based TFT because it shows that an In—Ge—Zn—O-based TFT can have fine transistor characteristics in a much wider metal composition range. In other words, the In—Ge—Zn—O-based oxide, which is a novel semiconductor material of the present invention, has a composition margin superior to that of an In—Ga—Zn—O-based oxide, which means that the In—Ge—Zn—O-based oxide has superior cost performance in mass production.

A composition range in terms of Zn content in which an In—Ga—Zn—O-based oxide assumes an amorphous phase is limited to Zn/(Zn+In+Ga).7 or less. On the other hand, for In—Ge—Zn—O-based oxide this value is extended to Zn/(Zn+In+Ge) composition range of 0.8 or less. The In—Ge—Zn—O-based oxide is thus wide in amorphous composition range.

A material that has a high Zn compositional ratio is a preferable material in view of cost because In and Ga are relatively rare and expensive elements compared to Zn which is also environmentally superior.

As has been described, a transistor using an In—Ge—Zn—O channel layer has advantages including fine performance, a large composition margin, and low material cost, and therefore is suitable for a drive circuit of organic LED displays.

Fifth Embodiment

Characteristics of In—Ge—Zn—O Film

In this embodiment, a film is formed by a combinatorial sputtering method in order to examine the dependency on the thin film material composition in a single step. By applying this technique to trial manufacture of a TFT, the channel composition dependency of TFT characteristics can be examined at once. A film having a wide composition range distribution is formed on a substrate by executing a combinatorial method through RF sputtering once.

The film is an In—Ge—Zn—O thin film formed with the use of three sputtering targets that are arranged at an angle with respect to the substrate. The composition of the thin film is varied depending on the location on the substrate. A film having a uniform (same) thickness and varied composition can be formed on a substrate in this manner. The employed targets are 2 inch-size ceramic targets of ZnO, GeO$_2$, and In$_2$O$_3$.

The applied power is 45 W for ZnO, 35 W for In$_2$O$_3$, and 30 to 45 W for GeO$_2$. The oxygen partial pressure was controlled with precision by using Ar+O$_2$ mixture gas diluted to 5% O$_2$ as well as Ar gas and controlling the flow rate. The substrate temperature is 25° C.

Table 7 illustrated thin film formation conditions of an In—Ge—Zn—O film.

The composition gradient film was 25 nm in thickness and had a film thickness distribution within ±10% according to an evaluation by ellipsometry.

TABLE 7

| In-Ge-Zn-O Thin Film Formation Condition | |
|---|---|
| Base pressure | <1 × 10$^{-5}$ Pa |
| Gas pressure | 0.34-0.48 Pa |
| Gas flow rate | Ar: 50 sccm |
| | Ar + O$_2$ (O$_2$:5%): 0-25 sccm |
| RF power | GeO$_2$ target: 30-45 W |
| | ZnO target: 45 W |
| | In$_2$O$_3$ target: 35 W |
| Substrate temperature | Room temperature |

The In—Ge—Zn—O composition distribution obtained using the deposition parameters listed in Table 7 was divided into 25 (5×5) segments, which for example were given sample names 1B, 1C, 1D, 2A, 2B, 2C, 2D, 2E, 3A, 3B, 3C, 3D, 3E, 4B, 4C, and 4D. On varying the RF power of GeO$_2$ between 30 and 45 samples other than listed above can be obtained. The ternary phase diagram in FIG. 29 lists each unique sample obtained using deposition parameters listed in Table 7. The compositional ratio In:Ge:Zn of each sample was analyzed by fluorescent X-ray analysis. The compositions are illustrated in the ternary phase diagram of FIG. 29.

Figure 29:
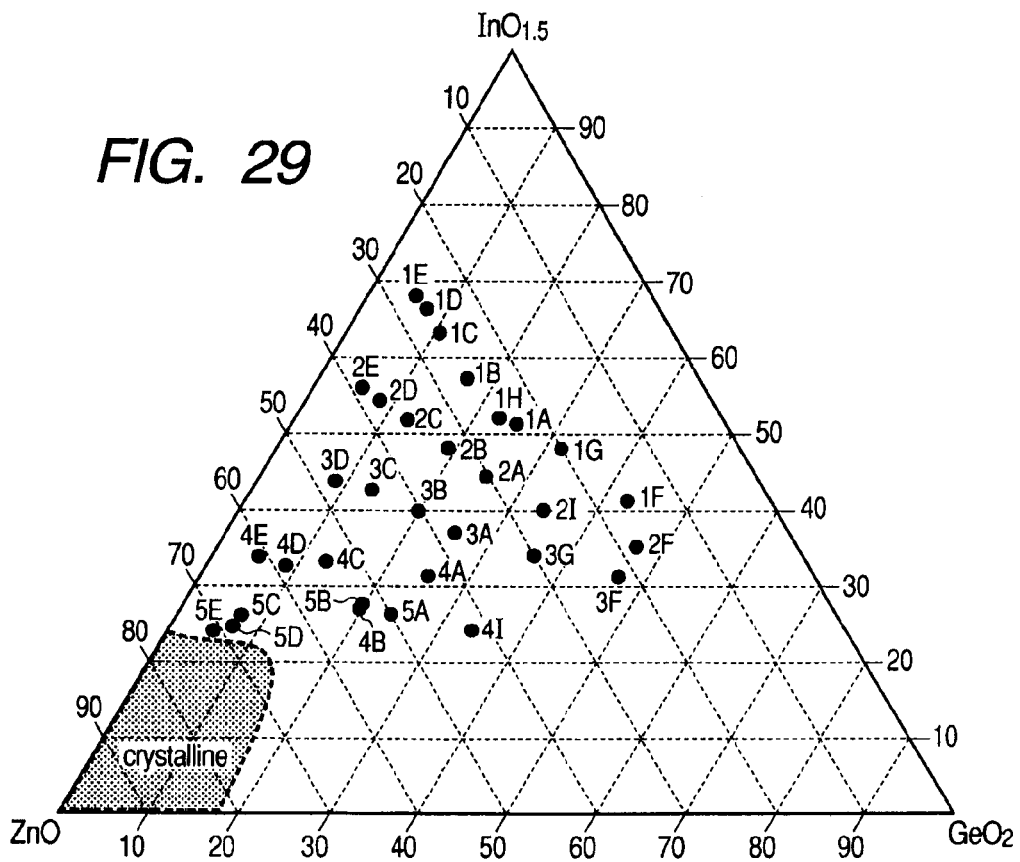
FIG. 29 is a ternary phase diagram illustrating structural characteristics of an In—Ge—Zn—O-based material.

FIG. 29 illustrates a composition region in which the film is amorphous and a composition region in which the film is crystalline. Whether a film is amorphous or not is identified by X-ray diffraction. All the points illustrated in FIG. 29 were found to be amorphous. The composition range in which the In—Ge—Zn—O film is crystalline is present in a high-Zn compositional ratio region. An area where the film is crystalline is a shaded area of FIG. 29 which is enclosed by a dashed line. What is to be noted is that the composition range in which the In—Ge—Zn—O-based film is amorphous is wider than a range in which an In—Ga—Zn—O-based film assumes an amorphous phase. Having a wide amorphous composition range is one of the advantages of the In—Ge—Zn—O-based material.

Spectroscopic ellipsometry and spectroscopy found that compositions 1A, 2A, 3A, 4A, 5A, and 1F which are large in Ge content have an optical absorption edge on the short wavelength side and has a small refractive index in the visible range. In short, a thin film large in Ge content has an advantage in that, when formed on a transparent substrate, the film exhibits excellent transmittance.

The composition dependency of the resistivity was evaluated next. In order to control the oxygen partial pressure during film formation, the Ar+O$_2$ flow rate is set to 20 sccm. It has been found that the resistivity is small at a composition that is large in In content whereas the resistivity is large at a composition that is large in Ge and/or Zn content. The In content in particular greatly affects the lowering of the resistivity. This can be due to the fact that a composition large in In content has a large oxygen vacancy concentration and an accordingly high carrier concentration, as well as a large electron mobility. In a composition large in Ge content, the Ge—O bonding energy is large and therefore oxygen deficiency is not likely exist. The thin film that has been annealed at 300° C. in the atmospheric air is described next. A pre-annealing resistivity (as-depo) and a post-annealing resistivity at compositions 1D, 2D, 3D, 4D, and 5D are shown in Table 8 and FIG. 30.

TABLE 8

| | In-Ge-Zn-O-Based Thin Film Resistivity | | |
|---|---|---|---|
| | Composition | Resistivity (ohm-cm) | |
| Point | Zn:Ge:In | As deposited | Post-annealing |
| 1D | 26:8:66 | 1E+03 | 2E+00 |
| 2D | 38:8:54 | 3E+03 | 1E+02 |
| 3D | 48:8:44 | 7E+04 | 7E+03 |
| 4D | 59:8:33 | 1E+06 | 3E+04 |
| 5D | 68:8:24 | >1E+06 | 6E+04 |

Figure 30:
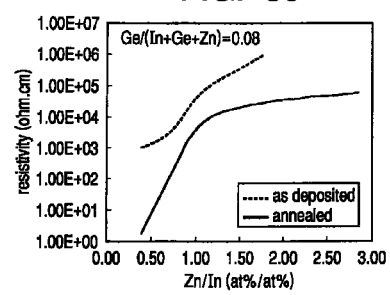
FIG. 30 is a graph illustrating Zn/In ratio dependency of resistivity of an as deposited In—Ge—Zn—O film and after annealing treatment in which compositional ratio Ge/(In+Ge+Zn) is approximately equal to 0.08 and the measured film has not received annealing treatment.

As illustrated in Table 8 and FIG. 30, the annealing lowers the resistivity, thereby expanding a composition range in which the film exhibits a semiconductor behavior suitable as a channel layer.

Figure 31:
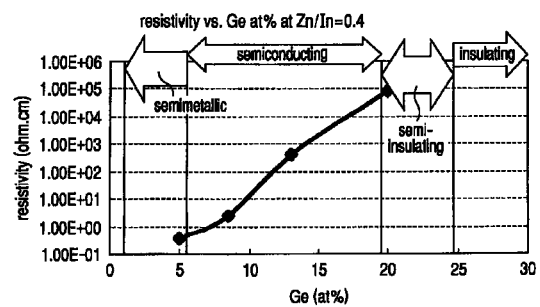
FIG. 31 is a graph illustrating Ge content (at %) dependency of the resistivity of an In—Ge—Zn—O film in which Zn/In=0.4 at deposition Ar+O2=20 sccm.

The Ge content dependency of the resistivity is described next. FIG. 31 illustrates the Ge content dependency of the resistivity. The compositional ratio Zn/(Zn+In) here is 0.4. It can be seen from the drawing that the resistivity rises as the Ge content increases.

Figure 32:
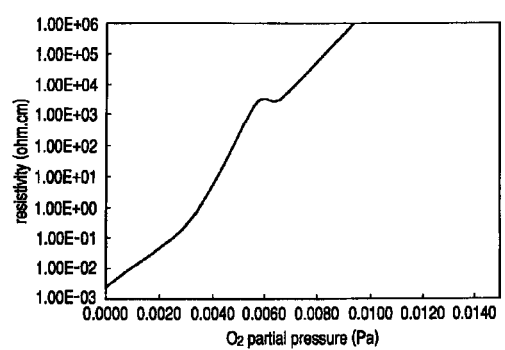
FIG. 32 is a graph illustrating dependency of the resistivity of an In—Ge—Zn—O film on oxygen partial pressure during film formation.

The dependency of the resistivity on the oxygen partial pressure in film formation is described next. The carrier concentration can be controlled with the oxygen partial pressure. This is probably because mainly the oxygen vacancy concentration is controlled by the oxygen partial pressure. FIG. 32 illustrates the oxygen partial pressure dependency of the carrier concentration of an In—Ge—Zn—O film. By controlling the oxygen partial pressure with precision, a thin film having semiconductor characteristics (a carrier concentration of about $10^{14}/cm^3$ to $10^{18}/cm^3$) is obtained. Employing such a thin film described above for a channel layer produces a TFT that exhibits favorable characteristics. As illustrated in FIG. 32, a thin film having semiconductor characteristics can be formed typically at a oxygen partial pressure of 0.008 Pa. The film is an insulator at an oxygen partial pressure of 0.01 Pa or more and is a conductor at a oxygen partial pressure of 0.002 Pa or less, which makes the film unsuitable as a channel layer.

The favorable oxygen partial pressure varies depending on the metal composition of the channel layer. For this reason, films formed at different levels of oxygen partial pressure were examined.

Figure 33:
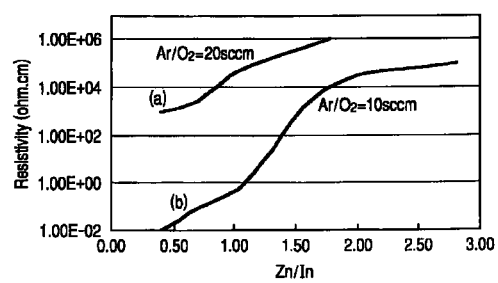
FIG. 33 is a graph illustrating the Zn/In ratio dependency of the resistivity of an In—Ge—Zn—O film in which a Ge content is approximately equal to 8 at %, and a flow rate of argon+oxygen gas in film formation is (a) 20 sccm and (b) 10 sccm.
Figure 34:
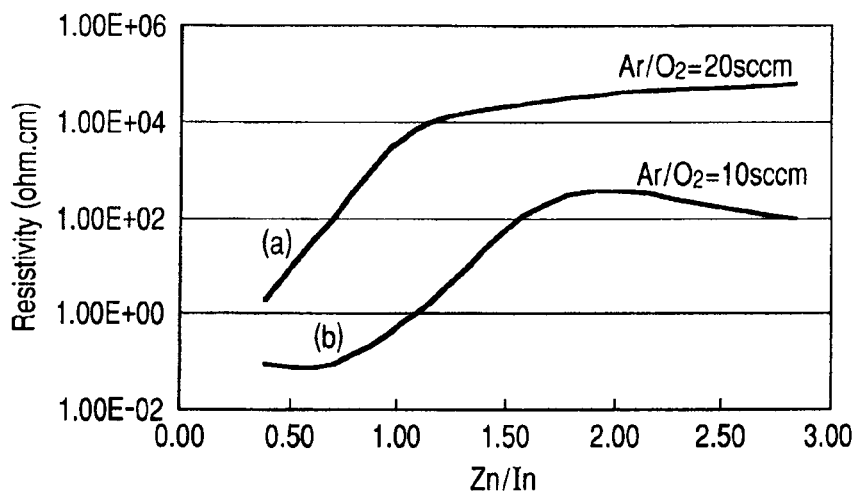
FIG. 34 is a graph illustrating the Zn/In ratio dependency of the resistivity of an In—Ge—Zn—O film in which the Ge content is approximately equal to 8 at %, the flow rate of argon+oxygen gas in film formation is (a) 20 sccm and (b) 10 sccm, and post-annealing treatment is performed at 300° C. in atmospheric air.
Figure 35:
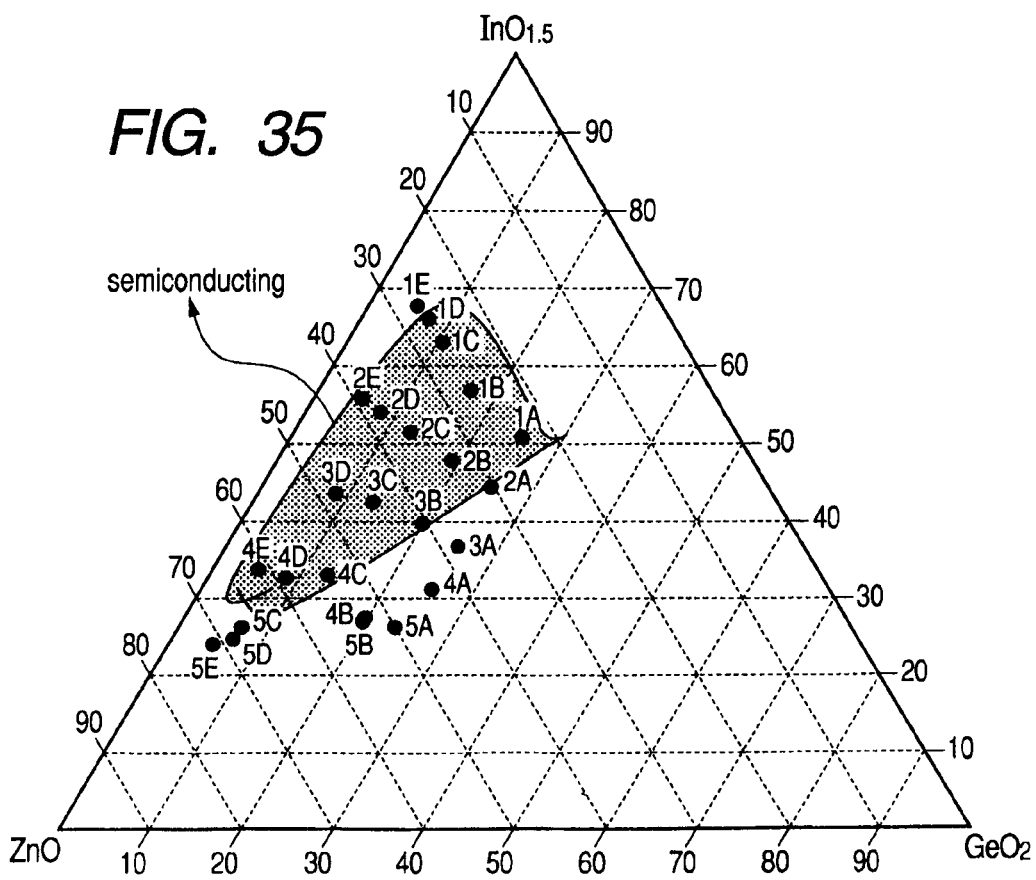
FIG. 35 is a diagram illustrating a resistivity mapping of an In—Ge—Zn—O film in which a flow rate of Ar+$O_2$ in film formation is 20 sccm and post-annealing treatment is performed at 300° C. in the atmospheric air.
Figure 36:
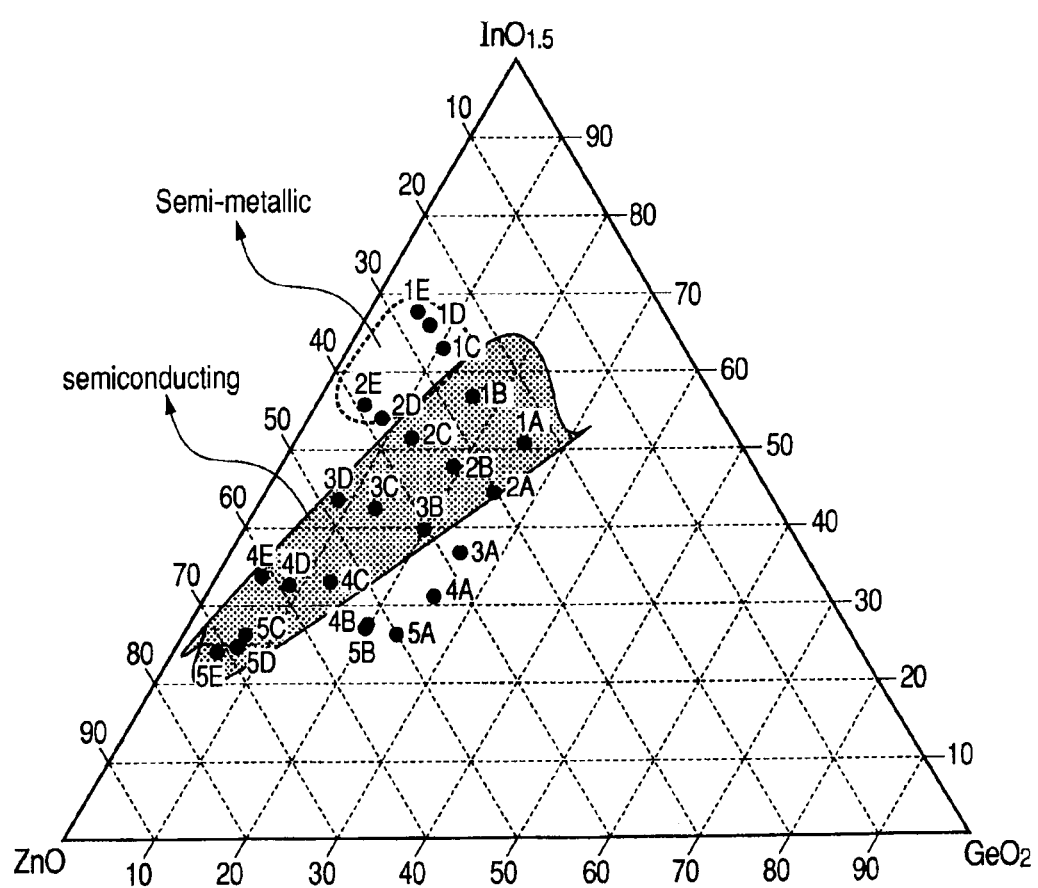
FIG. 36 is a diagram illustrating a resistivity mapping of an In—Ge—Zn—O film in which a flow rate of Ar+$O_2$ in film formation is 10 sccm and post-annealing treatment is performed at 300° C. in the atmospheric air.
Figure 37A:
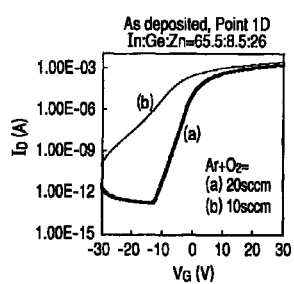
FIGS. 37A and 37B are graphs illustrating transfer characteristics of a composition 1D (In:Ge:Zn=65.5:8.5:26) in which the Ar/$O_2$ flow rate in film formation is 20 sccm in FIGS. 37A and 10 sccm in FIG. 37B, and a sample of FIG. 37A has not received annealing treatment whereas a sample of FIG. 37B has received post deposition annealing treatment.
Figure 37B:
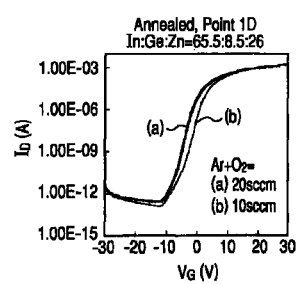
Figure 38A:
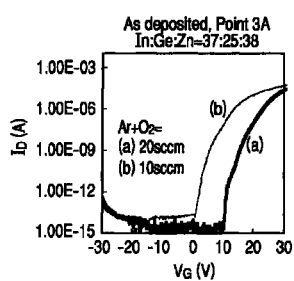
FIGS. 38A and 38B are graphs illustrating transfer characteristics of a composition 3A (In:Ge:Zn=37:25:38) in which the Ar/$O_2$ flow rate in film formation is 20 sccm in FIGS. 38A and 10 sccm in FIG. 38B, and a sample of FIG. 38A has not received annealing treatment whereas a sample of FIG. 38B has received post deposition annealing treatment.
Figure 38B:
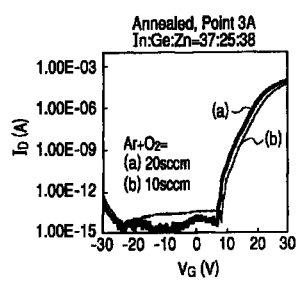
Figure 39A:
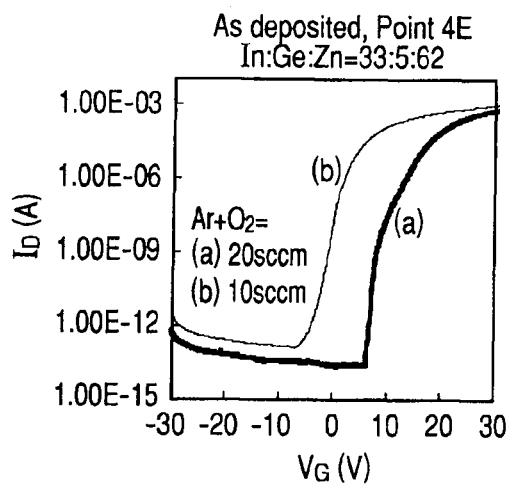
FIGS. 39A and 39B are graphs illustrating transfer characteristics of the composition 4E (In:Ge:Zn=33:5:62) in which the Ar/$O_2$ flow rate in film formation is 20 sccm in FIGS. 39A and 10 sccm in FIG. 39B, and a sample of FIG. 39A has not received annealing treatment whereas a sample of FIG. 39B has received post deposition annealing treatment.
Figure 39B:
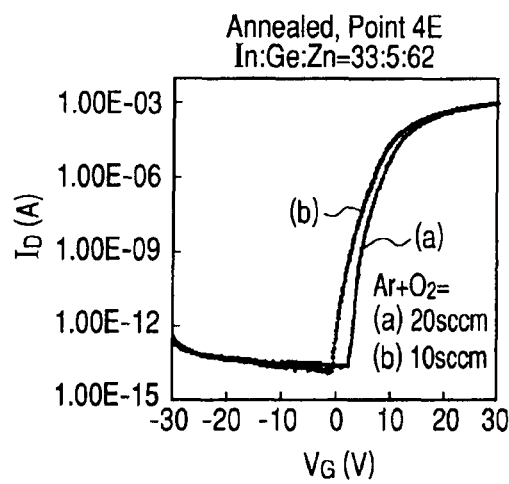

FIG. 33 is a resistivity comparison between In—Ge—Zn—O films formed with the flow rate of $Ar+O_2$ ($Ar+O2$ gas mixture is shown as Ar/O2 in FIG. 33 and FIG. 34) set to 20 sccm and 10 sccm. FIG. 34 illustrates the resistivities of the films after being annealed at 300° C. for an hour. It can be seen from the diagram that the resistivity is small when the $Ar+O_2$ flow rate is small. This can be ascribed to an increase in oxygen deficiency amount while the $Ar+O_2$ flow rate is small. As illustrated in FIG. 34, the annealing lowers the resistivity. The behavior of the resistivity was illustrated in phase diagrams of FIG. 35 (20 sccm) and FIG. 36 (10 sccm).

The composition range in which a film exhibits a resistivity suitable for the channel layer of a TFT shifts depending on the oxygen partial pressure.

Sixth Embodiment

Compositional Ratio Dependency of In—Ge—Zn—O TFT

This embodiment is an example of examining the composition dependency of an In—Ge—Zn—O TFT by the same method that is employed in the second embodiment (an embodiment that deals with the composition dependency of In—Ge—O TFTs). This embodiment employs a combinatorial method for trial manufacture of a TFT. A thin film for the channel layer is formed by a method as the one in the second embodiment. The film thickness of the channel layer is about 25 nm.

Results of the composition dependency of the transfer characteristics of an In—Ge—Zn—O TFT are described below. In forming the channel layer, the flow rate of $Ar+O_2$ gas is set to 20 sccm. It has been found that a TFT having an In-rich composition (the composition range surrounded by "a", "i", and "h" in FIG. 57) has a relatively large on-current and a large field effect mobility of 7 $cm^2$NS or more. If the In content is too large (97 at % or higher), applying a negative gate voltage causes a current as large as when a positive gate voltage is applied to flow. In short, a TFT with too large an In content did not exhibit transistor operation.

When the channel layer composition is in the range surrounded by "a", "i", and "h" in FIG. 57, a transistor having a large on-current and a negative turn-on voltage has been obtained. As the Ge content increases, the off-current decreases and the mobility becomes smaller. The threshold voltage takes a positive value and, as a result, normally-off characteristics (characteristics where a TFT is off and substantially no current is let flow unless a gate voltage is not applied) are obtained. In this particular example, at a Ge content between 3 at % and 25 at %, an on/off current ratio of $10^9$ or more and a small off-current are obtained, and the mobility takes a value between 3 $cm^2$N s and 16 $cm^2$N s. A transistor having the largest mobility was obtained at a composition that is large in In content and Zn content. A preferable composition range is a Zn-rich composition region where Zn/(In+Zn+Ge) is approximately equal to 0.65 and overall fine TFT characteristics are obtained. The obtained mobility, on/off current ratio, threshold voltage, and S value were 15.65 $cm^2(V\cdot S)^{-1}$, $1\times10^{11}$, 6 V, and 0.26 V/decade, respectively. Results of X-ray diffraction confirmed that an In—Ge—Zn—O film in this preferable composition region was amorphous. Further, a transistor having a very small S value was obtained in a Zn-rich region surrounded the points "s", "x", "y" "v", and "b".

In a composition range surrounded by "s", "u", "t", and "n", all TFT characteristics (mobility, on/off current ratio, normally-off characteristics) were fine.

It has been confirmed that TFT operation is executable when a thin film with a resistivity of a few Ω·cm to a few hundred Ω·cm is used as the channel layer.

Described next are the TFT characteristics of a TFT whose channel layer is formed under a condition that sets the flow rate of $Ar+O_2$ to 10 sccm. The dependency on the oxygen partial pressure in forming an In—Ge—Zn—O film has thus been researched. The on/off current ratio and threshold voltage of a TFT that does not receive annealing treatment grow larger as the oxygen flow rate ratio increases. The resistivity of the In—Ge—Zn—O film is higher when the $Ar+O_2$ gas flow rate is 20 sccm than when the $Ar+O_2$ gas flow rate is 10 sccm. As a result, the composition region in which transistor operation is executable shifts toward the In-rich composition region. A TFT having a large mobility can be consequently obtained. It has been found that, when the oxygen partial pressure in film formation is large, the threshold voltage of a transistor that has not received annealing treatment shifts toward the positive direction. In other words, the performance of a transistor that has not received annealing treatment (as-deposit) is influenced by the oxygen partial pressure (oxygen flow rate) in film formation.

On the other hand, the performance of a TFT that has received annealing treatment at 300° for an hour was hardly affected by the oxygen partial pressure in film formation. Even in the cases where the resistivity after the annealing was affected by the oxygen partial pressure in film formation, the TFT characteristics (on/off current ratio, threshold voltage, mobility, and the like) hardly changed. This indicates that an In—Ge—Zn—O-based TFT has a wide characteristics margin for the oxygen partial pressure in film formation, namely, a wide process margin. This result is illustrated in FIGS. 37A and 37B, FIGS. 38A and 38B, and FIGS. 39A and 39B. Those diagrams illustrate a change in transfer characteristics which follow a change in oxygen partial pressure during film formation at various metal element compositions. 1D is an In-rich (the In content is 60 at % or higher) composition, 4E is a Zn-rich (the Zn content is 60 at % or higher) composition, and 3A is a composition in which the Ge content is approximately equal to 25 at %. TFT characteristics at those compositions are organized in Table 9.

Table 9 shows the compositions of TFTs having various channel compositions which are organized by the Ar+$O_2$ gas (Ar+$O_2$ mixture in which Ar:O2=95:5) flow rate employed in forming the channel layer. Table 9 also shows (as-depo) data evaluated without performing annealing treatment after the TFT is formed and data evaluated after the annealing (Post anneal).

TABLE 9

TFT Composition Sorted by Channel Composition

| Ar+$O_2$ sccm | In:GE:Zn | Point TFT | As deposited | | | | Post-annealing | | | |
|---|---|---|---|---|---|---|---|---|---|---|
| | | | Von (V) | On/Off | S | μ | Von | On/off | S | μ |
| 20 | 65.5:8.5:26 | 1D | −12.3 | 1E+10 | 1.4 | 12 | −10.8 | 1E+10 | 1.00 | 11.23 |
| | 37:25:38 | 3A | 10.4 | 1E+10 | 0.4 | 1.5 | 6.9 | 1E+10 | 0.67 | 2.5 |
| | 33:5:62 | 4E | 6.3 | 5E+10 | 0.44 | 12.2 | 2.4 | 1E+11 | 0.5 | 12.28 |
| 10 | 65.5:8.5:26 | 1D | — | 1E+7 | — | 10.6 | −11.3 | 2E+10 | 1.0 | 12.01 |
| | 37:25:38 | 3A | 0.8 | 1E+10 | 0.74 | 0.5 | 8.5 | 1E+10 | 0.5 | 2.26 |
| | 62:5:33 | 4E | −5.8 | 1E+10 | 0.74 | 8.8 | −0.7 | 1E+11 | 0.6 | 11.5 |

Composition regions in which the largest field effect mobility was obtained are an In-rich composition region and a Zn-rich composition region. For example for a TFT deposited at Ar+$O_2$=10 sccm and post annealed a thin film transistor having as high a mobility as 11.5 cm$^2$/(V·S)$^{-1}$ was obtained at a compositional ratio in which Zn was 62 at %, In was 33 at %, and Ge was 5 at %, namely, a composition in which the Zn content was larger than the content of any other element. The obtained on/off current ratio, turn-on voltage (Von), and S value were 1×10$^{11}$, −0.7 V, and 0.6 V/decade, respectively. Characteristics obtained when the Ar+$O_2$ gas flow rate ratio in forming the channel layer was changed to 20 sccm were substantially the same.

Figure 40:
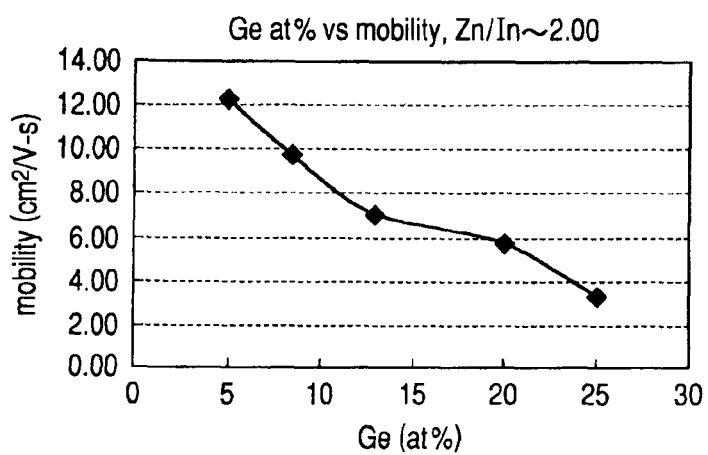
FIG. 40 is a graph illustrating Ge content (at %) dependency of field effect mobility in which the Zn/In compositional ratio is constant.

Next, In—Ge—Zn—O TFTs having channels of various Ge compositional ratios are described by comparison with reference to FIG. 40 and Table 10. A transistor having a Ge content expressed as Ge/(In+Ge+Zn)=25 at % was evaluated and found to have a field effect mobility ~3 cm$^2$/Vs. A field effect mobility exceeding 12 cm$^2$/Vs was obtained when an oxide having a Ge content of 5 at % was used. In short, reducing the Ge content increases the field effect mobility.

TABLE 10

Ge Content Dependency of Mobility: Zn/In Content Is Approximately Equal to 2.

| Ge at % | 5.0 | 8.5 | 13 | 20 | 25 |
|---|---|---|---|---|---|
| Mobility | 12.29 | 9.8 | 7.05 | 5.78 | 3.31 |

Figure 41:
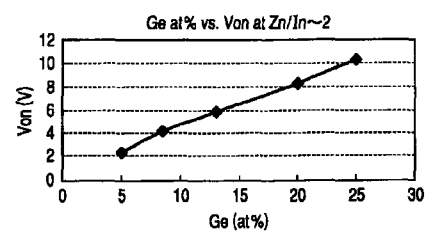
FIG. 41 is a graph illustrating the Ge content (at %) dependency of turn-on voltage (Von, V) in which the Zn/In compositional ratio is constant.

Using a thin film transistor that has a threshold voltage of 0 V or higher facilitates electronic circuit construction. FIG. 41 and Table 11 show the Ge content dependency of the turn-on voltage Von of an In—Ge—Zn—O-based TFT. The Zn/In compositional ratio here is fixed. As illustrated in FIG. 41, a TFT that has a positive turn-on voltage Von and accordingly a positive threshold voltage is obtained when Zn/In~2 and Ge/(Zn+In+Ge) is 0.03 or more and 0.5 or less. Von is 2.4 when the Ge content is 5 at % and, as the Ge content increases up to 25 at %, Von shifts toward a large positive value 10.3. In short, a normally-off transistor is easily obtained by increasing the Ge content. The turn-on voltage Von and the threshold voltage Vth shift toward more positive values following an increase in Ge content.

TABLE 11

Ge Content Dependency of Von (V): Zn/In Ratio Is Approximately Equal to 2.

| Ge at % | 5.0 | 8.5 | 13 | 20 | 25 |
|---|---|---|---|---|---|
| Von (V) | 2.4 | 4.2 | 5.9 | 8.3 | 10.3 |

Figure 42:
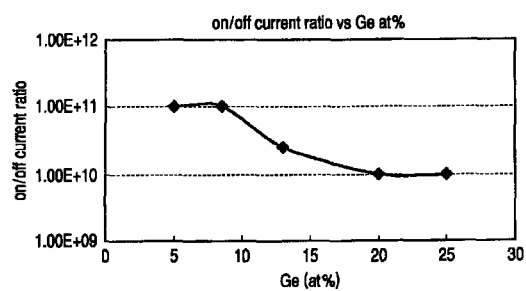
FIG. 42 is a graph illustrating the Ge content (at %) dependency of on/off current ratio in which the Zn/In compositional ratio is approximately equal to 2.

A high performance switching device is requested to have a high on/off current ratio. FIG. 42 and Table 12 show the effects of adding Ge as a component over the on/off current ratio. As the Ge content increases to 25 at %, the on/off current ratio decreases to 1E+10 although an In—Ge—Zn—O-based TFT in general has large on/off current ratio, the value reduces with increasing Ge content, which, in general, is significantly large in on/off current ratio, can have a particularly large on/off current ratio by increasing the Ge content.

TABLE 12

Ge Content Dependency of On/Off Current Ratio

| Ge at % | 5.0 | 8.5 | 13 | 20 | 25 |
|---|---|---|---|---|---|
| on/off | 8.64E+10 | 1.22E+11 | 2.5E+10 | 1.0E+10 | 1E+10 |

Figure 43A:
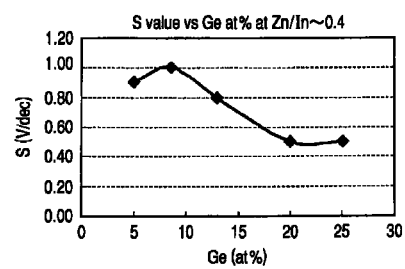
FIGS. 43A and 43B are graphs illustrating the Ge content (at %) dependency of subthreshold swing value (S, V/dec) in which the Zn/In compositional ratio is approximately equal to 0.4 in FIG. 43A and approximately equal to 2 in FIG. 43B.
Figure 43B:
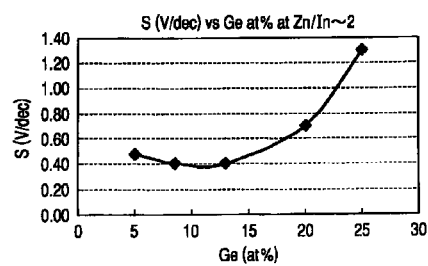

The effects of adding Ge as a component over the S value are described next. FIGS. 43A and 43B, and Tables 13 and 14 show the Ge content dependency of the S value (V/dec) of an In—Ge—Zn—O-based TFT. Data in FIG. 43A and data in Table 13 are obtained when the Zn/In compositional ratio is approximately equal to 0.4, and data in FIG. 43B and data in Table 14 are obtained when the Zn/In compositional ratio is approximately equal to 2. It can be seen from the drawings that a TFT having an In-rich composition (FIG. 43A) and a TFT having a Zn-rich composition (FIG. 43B) have different dispositions.

The S value is about 0.9 when Zn/In is approximately equal to 0.4 and the Ge content is approximately equal to 5 at %. The S value is about 0.5 V/dec when Zn/In is approximately equal to 0.4 and the Ge content is 25 at %. In short, at an In-rich composition, the S value decreases as the Ge content increases.

TABLE 13

S Value (V/dec) vs. the Ge content at Zn/In = 0.4

| Ge at % | 5.0 | 8.5 | 13 | 20 | 25 |
|---|---|---|---|---|---|
| S (V/dec) | 0.9 | 1.0 | 0.8 | 0.5 | 0.5 |

The effects of Ge over a composition that is large in Zn content are illustrated in FIG. 43B and Table 14. The S value is about 0.5 when Zn/In is approximately equal to 2 and the Ge content is 5 at %. The S value increases to 1.3 or so as the Ge content increases to 25 at %. In short, the S value of a TFT that has a composition large in Zn content grows larger as the Ge content increases.

TABLE 14

Ge Content Dependency of S Value: Zn/In Ratio Is Approximately Equal to 2.

| Ge at % | 5.0 | 8.5 | 13 | 20 | 25 |
|---|---|---|---|---|---|
| S (V/dec) | 0.48 | 0.4 | 0.4 | 0.7 | 1.3 |

Consequently, as the Ge content decreases, the field effect mobility ($\mu_{FE}$, cm$^2$/V s) and the on/off current ratio increase and Vth shifts toward the negative direction. When the In content is 45 at % (In/(In+Ge+Zn)<0.45), on the other hand, an increase in Ge content increases the S value.

The mobility is one of the most important TFT characteristics parameters, because the mobility contributes to the performance of the semiconductor channel layer, especially the current drive ability and the maximum drive frequency. Indeed, a TFT for use in a liquid crystal display is requested to have a mobility of 0.1 cm$^2$/V-s or more, and a TFT for use in an organic EL display is required to have a mobility of 1 cm$^2$/V-s or more. The required mobility varies depending on the application. In the present invention, a mobility high enough to drive an organic EL device is obtained when the compositional ratio Zn/(Zn+In) is 0.10 or more and 0.86 or less and the Ge content expressed by Ge/(Ge+In+Zn) is 0.03 or more and 0.3 or less. Fine TFT characteristics are obtained when the compositional ratio In/(In+Ge) is 0.10 or more and 0.75 or less and the Ge content expressed by Ge/(Ge+In+Zn) is 0.03 or more and 0.15 or less, which is a preferable composition margin.

Figure 44:
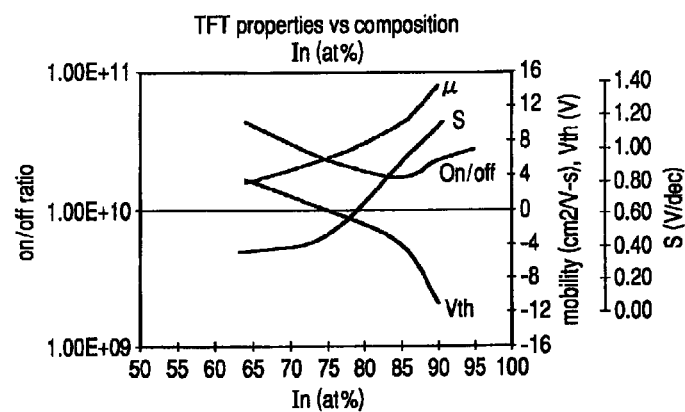
FIG. 44 is a graph illustrating In content dependency of characteristics of an In—Ge—O-based TFT.

Therefore, in order to obtain a thin film transistor that has a high mobility and a small S value, the Ge content is preferably small. From this standpoint, the Ge content expressed by Ge/(Ge+In+Zn) is desirably 0.3 or less, more desirably 0.03 or more and 0.15 or less. The TFT characteristics of a TFT that uses In—Ge—O having the Zn content of 0 at % are as illustrated in FIG. 44, in which the mobility and the S value increase and the threshold voltage shifts toward the negative direction as the In content increases. The TFT obtains a small S value when the compositional ratio expressed by In/(In+Ge) is 0.9 or less. A TFT having a significantly small S value is obtained when In/(In+Ge) is 0.50 or more and 0.85 or less.

Described next are results of an experiment about how TFT characteristics behave in relation to the Zn/In ratio when the Ge content is fixed.

Figure 45:
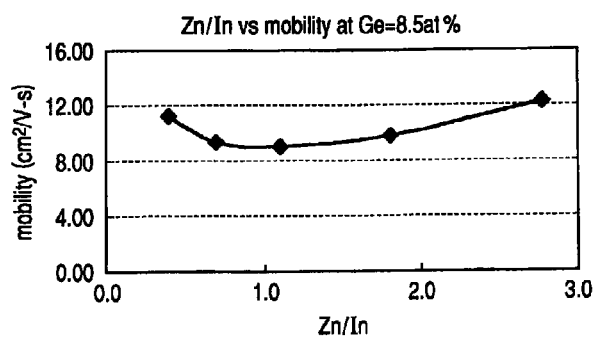
FIG. 45 is a graph illustrating Zn/In compositional ratio dependency of the field effect mobility in an In—Ge—Zn—O-based TFT in which the Ge content is approximately equal to 8 at %.

FIG. 45 and Table 15 show the Zn/In ratio dependency of the field effect mobility $\mu_{FE}$. The Ge content here is 8.5 at %. The mobility is large when the Zn concentration is high and when the In concentration is high.

TABLE 15

Zn/In Ratio Dependency of Field Effect Mobility. The Ge Content Is Equal to 8.5 at %.

| Zn/In | 0.4 | 0.69 | 1.09 | 1.8 | 2.78 |
|---|---|---|---|---|---|
| $\mu_{FE}$(cm$^2$/Vs) | 11.23 | 9.29 | 9.05 | 9.80 | 12.26 |

Figure 46:
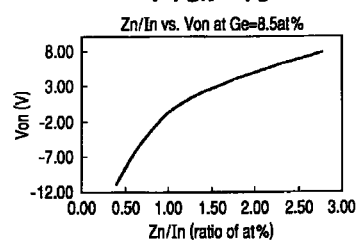
FIG. 46 is a graph illustrating the Zn/In compositional ratio dependency of Von in an In—Ge—Zn—O based TFT in which the Ge content is approximately equal to 8 at %.

FIG. 46 and Table 16 show the Zn/In ratio dependency of Von.

TABLE 16

Zn/In Ratio Dependency of Von. The Ge Content Is 8.5 at %.

| Zn/In | 0.4 | 0.69 | 1.09 | 1.8 | 2.78 |
|---|---|---|---|---|---|
| Von | −10.8 | −4.9 | 0.1 | 4.2 | 7.8 |

It can be seen that Von takes a negative value when the Zn/In ratio is smaller than 1. As the Zn/In ratio grows past 1, Von (and Vth as well) starts to take a positive value.

Figure 47:
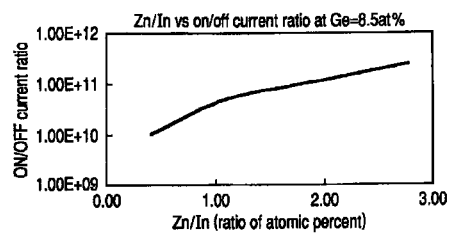
FIG. 47 is a graph illustrating the Zn/In compositional ratio dependency of on/off current ratio in the In—Ge—Zn—O based TFT in which the Ge content is approximately equal to 8 at %.

FIG. 47 and Table 17 show the Zn/In ratio dependency of the on/off current ratio.

TABLE 17

Zn/In Ratio Dependency of on/off Current Ratio. The Ge Content Is Equal to 8.5 at %.

| Zn/In | 0.4 | 0.69 | 1.09 | 1.8 | 2.78 |
|---|---|---|---|---|---|
| On/off | 1E+10 | 2E+10 | 5E+10 | 1E+11 | 2.5E+11 |

It can be seen from the diagrams that a large on/off current ratio of 10$^{10}$ or more is obtained throughout a wide composition range. The on/off current ratio monotonously increases as the Zn/In ratio rises.

Figure 48:
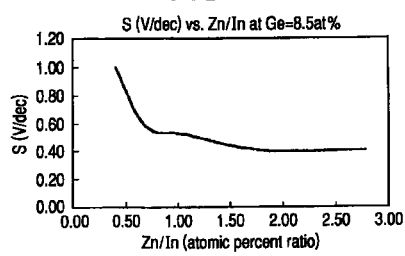
FIG. 48 is a graph illustrating the Zn/In compositional ratio dependency of subthreshold swing value in the In—Ge—Zn—O based TFT in which the Ge content is approximately equal to 8 at %.

FIG. 48 and Table 18 show the Zn/In ratio dependency of the S value. It can be seen from the diagrams that the S value increases monotonously with respect to the Zn/In ratio.

TABLE 18

Zn/In Ratio Dependency of S Value. The Ge Content Is Equal to 8.5 at %.

| Zn/In | 0.4 | 0.69 | 1.09 | 1.8 | 2.78 |
|---|---|---|---|---|---|
| S (V/dec) | 1.00 | 0.58 | 0.5 | 0.4 | 0.4 |

Next, the oxygen flow rate during channel layer formation was further increased to fabricate In—Ge—Zn—O TFTs with the Ar+O$_2$ flow rate set to 40 sccm and 50 sccm. In a TFT having a composition large in Ge content, the current did not rise despite application of a gate current, and the TFT did not exhibit switching characteristics. A large field effect mobility and a small S value were obtained at a composition small in Ge content. The obtained characteristics values were not inferior to those obtained when the Ar+O$_2$ flow rate was set to 20 sccm. In particular, the TFT exhibited a field effect mobility of 7 cm$^2$/Vs or more and an S value of 1 V/decade or less when the Ge content was 15 at % or less.

The results of this embodiment, namely, the composition dependency of an In—Ge—Zn—O TFT, are summarized concisely below.

The mobility and the on/off current ratio are large, the hysteresis is small, and Von is negative at an In-rich composition (area surrounded by "a", "i", and "h" in FIG. 57).

At a Ge-rich composition (area surrounded by "h", "v", "c", and "d"), the off-current is small (<$10^{14}$ A), the on/off current ratio is large, and the threshold voltage is positive. The stability against light and light transmittance are excellent.

At a Zn-rich composition (area surrounded by "s", "u", "x", "y", "v", and "b"), the mobility and the on/off current ratio are large, the off-current and the S value are relatively small, and the drive stability is relatively good.

The influence of the oxygen partial pressure in film formation is discussed next.

In the case where annealing treatment is not performed, a rise in oxygen partial pressure in film formation moves the composition range in which transistor operation is executable toward the In-rich side. This is beneficial from the standpoint of increasing the mobility. In the case where annealing treatment is performed, however, the influence of the deposition oxygen partial pressure is not large.

Figure 49A:
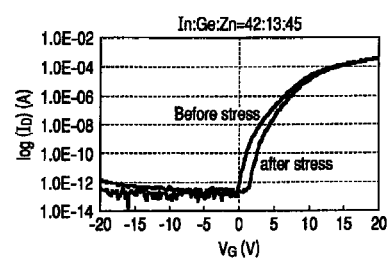
FIGS. 49A and 49B are graphs illustrating changes in characteristics of an In—Ge—Zn—O-based TFT due to DC drive stress in which the compositional ratio of a channel is set to In:Ge:Zn=42:13:45 in FIG. 49A and to In:Ge:Zn=32:8:60 in FIG. 49B.
Figure 49B:
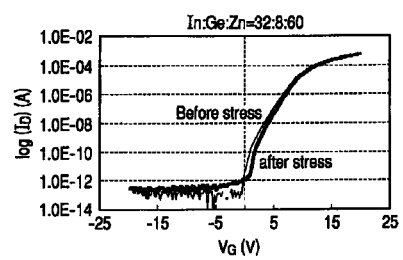

Results of evaluating the DC drive stability are described next. Direct current stress of a gate voltage $V_G$ of 12 V and a source-drain voltage $V_D$ of 6 V has been applied for 800 seconds, and TFT characteristics before and after the stress were compared for evaluation. FIGS. 49A and 49B illustrate transfer characteristics before and after stress. The compositional ratio In:Ge:Zn here is set to 42:13:45 and 32:8:60. With the former and the latter, the threshold voltage has been observed to shift toward the positive side by 1.48 V and 0.45 V, respectively. It is found that fine drive stability is obtained when the Zn content is large.

Table 19 is a list of the characteristics of TFTs including various In—Ge—Zn—O channels. "–" in Table 19 indicates that the item has not been looked into.

TABLE 19

In-Ge-Zn-O-Based TFT Characteristics List

| In:Ge:Zn [Compositional ratio: Atomic ratio] | Field-effect mobility [cm²/V s] | S value [V/decade] | On/off current ratio On/off | Threshold voltage Vth [V] | Threshold voltage shift Threshold shift [V] |
|---|---|---|---|---|---|
| 51:25:24 | 4 | 0.6 | 2E+10 | 8 | — |
| 57:17:26 | 6 | 0.8 | 1E+10 | 4 | — |
| 63:11:26 | 8 | 1.22 | 4E+9 | 1 | — |
| 66:8:26 | 11 | 1.4 | 1E+10 | −1 | — |
| 68:5:27 | 13.75 | 1.5 | 1E+10 | −2 | — |
| 56:5:39 | 11.2 | 1.1 | 1E+10 | 0 | — |
| 42:13:45 | 7.3 | 0.5 | 1E+11 | 7.7 | 1.48 |
| 44:5:50 | 10.5 | 0.64 | 1E+10 | 5 | 0.54 |
| 32:8:60 | 9.8 | 0.38 | 5E+10 | 11 | 0.45 |
| 36:35:29 | 4.4 | 0.6 | 7e+10 | 4.43 | — |

Seventh Embodiment

Compositional Ratio Dependency of In—Ge—Zn—O TFT II

This embodiment is an example of examining the composition dependency of an In—Ge—Zn—O-based TFT over a Ge content range of 3 at % to 15 at % (smaller Ge content range compared with the sixth embodiment). A TFT that exhibits fine temporal stability and favorable characteristics is obtained in this composition range. In addition, a fluctuation between devices and a fluctuation between lots are small, which enables fabrication of the TFT with excellent reproducibility.

The same apparatus as the one described in the first embodiment was employed to form an In—Ge—Zn—O thin film. Table 20 shows thin film formation conditions.

TABLE 20

| Film Deposition Conditions | |
|---|---|
| Base pressure | <1 × $10^{-4}$ Pa |
| Total pressure | 0.34-0.45 Pa |
| Gas flow rate | Ar: 50 sccm |
| | Ar +$O_2$ Mixture gas ($O_2$:5%):10-20 sccm |
| RF power | $In_2O_3$ Target: 35 W |
| | ZnO Target: 45W |
| | $GeO_2$ Target: 20 W |
| Substrate temperature | Room temperature |
| Film formation time | Thin film for physical property evaluation: 30 minutes, Channel layer: 3-5 minutes |
| Substrate | Thin film for physical property evaluation: 4-inch silicon with thermal oxide film |
| | Channel layer: 3-inch silicon with thermal oxide film |

Figure 50:
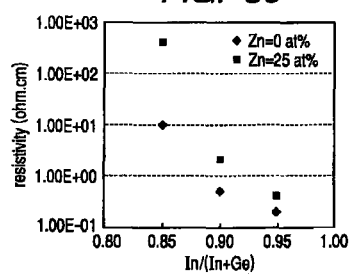
FIG. 50 is a graph illustrating compositional ratio In/(In+Ge) dependency of resistivity of an In—Ge—Zn—O film in which data is obtained by setting Zn content to 0 at % and 25 at %.

The In—Ge compositional ratio dependency (Zn content is fixed) of the resistivity of an In—Ge—Zn—O film was evaluated and found to have a disposition similar to that of an In—Ge—O-based thin film. FIG. 50 is a diagram comparing the In/(In+Ge) compositional ratio dependency of the resistivity of an In—Ge—O-based film and the In/(In+Ge) compositional ratio dependency of an In—Ge—Zn—O-based film. The Zn content in the In—Ge—Zn—O-based film is 0 at % and 25 at %. It can be seen from FIG. 50 that the resistivity of the In—Ge—Zn—O-based film is larger than the resistivity of the In—Ge—O-based film when the In/(In+Ge) compositional ratio is the same. The In—Ge—Zn—O-based film thus has a wider composition range in which a resistivity suitable for the channel of a TFT (a few Ω·cm to a few 100 Ω·cm) is obtained than the In—Ge—O-based film.

Figure 51A:
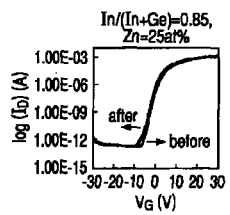
FIGS. 51A, 51B and 51C are graphs illustrating transfer characteristics right after TFT fabrication and three months after fabrication when Zn/(Zn+In+Ge)=0.25 while In/(In+Ge)=0.85, 0.9 and 0.95 in FIG. 51A, FIG. 51B and FIG. 51C, respectively.
Figure 51B:
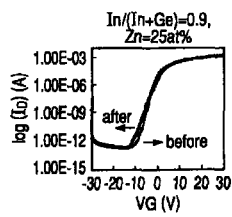
Figure 51C:
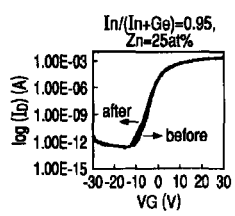

Further, the resistivity of the In—Ge—Zn—O-based film has high temporal stability. At an In-rich composition (In/(In+Ge)≥0.85), in particular, the resistivity of the In—Ge—Zn—O-based film is more stable than the resistivity of the In—Ge—O-based film. Results of comparing, for evaluation, the transfer characteristics of an In—Ge—Zn—O TFT (Zn/(In+Ge+Zn)=0.25, 0.95≥In/(In+Ge)≥0.85) immediately after the TFT is fabricated and three months after the fabrication are illustrated in FIGS. 51A to 51C. It can be seen from the diagrams that a TFT of the above-mentioned composition has temporal stability.

Next presented are results of examining the composition dependency (the Ge-ratio is 3 at % to 15 at %) of an In—Ge—Zn—O TFT. The TFT has the same structure as in the sixth embodiment.

Figure 52:
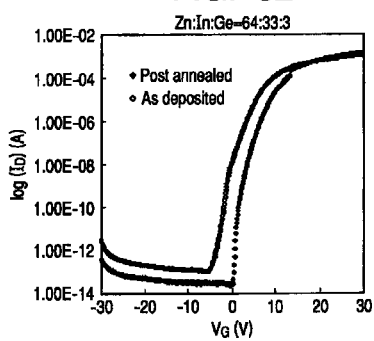
FIG. 52 is a graph illustrating the transfer characteristics of In—Ge—Zn—O TFTs in which the compositional ratio is set to In:Ge:Zn=33:3:64 and the characteristics illustrated are of a device that has not received annealing and of a device that has received post-deposition annealing treatment.

TFTs exhibiting similar characteristics were successfully fabricated with good reproducibility by employing an In—Ge—Zn—O-based channel layer. In particular, at a composition whose In content is 65 at % or more to 33 at % or less and Ge content is 10 at %, the reproducibility of the mobility is good and a mobility of 10 cm²/Vs or more was obtained. The TFT exhibited the best characteristics in terms of mobility, on/off current ratio, threshold, and S value when In:Ge:Zn is 33:3:64. The best mobility, on/off current ratio, S value, turn-on voltage, and threshold voltage are 15.65 cm²/Vs, $10^{11}$, 0.26 V/decade, 0.1V, and 6 V, respectively. The transfer characteristics of a device having this best composition are illustrated in FIG. 52. In this way, using an In—Ge—Zn—O-based channel produces a TFT of superb characteristics.

Patent Document 1 gives In:Ga:Zn=38:5:57 as a preferable composition of an In—Ga—Zn—O-based material. The most desirable composition of an In—Ge—Zn—O-based material is Zn:In:Ge=64:33:3. This composition has superior cost performance because its Zn content is larger than that of the preferable composition of the In—Ga—Zn—O-based material.

Figure 53:
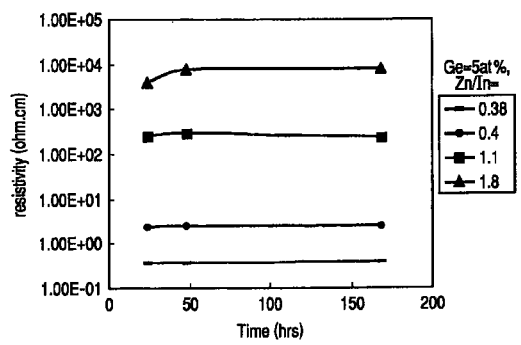
FIG. 53 is a graph illustrating resistivity (ohm-cm) vs. time (hrs) of an In—Ge—Zn—O film in which the Ge content is approximately equal to 5%, while Zn/In atomic ratio is varied.
Figure 54:
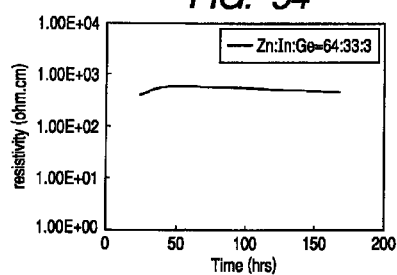
FIG. 54 is graph illustrating the resistivity (ohm-cm) vs. time (hrs) of an In—Ge—Zn—O film in which the compositional ratio is set to Zn:In:Ge=64:33:3.

Next, in order to examine the temporal stability of an In—Ge—Zn—O film, the film was evaluated for changes in resistivity due to being stored in the atmospheric air. FIG. 54 illustrates the change in resistivity of In:Ge:Zn=33:3:64 with time. It is seen that there is no appreciable change in resistivity with time. It was found as a result that, if the Ge content is 3 at % or more, the resistivity hardly changes after six months of storage in the atmospheric air irrespective of the value of Zn/In. FIG. 53 is a diagram illustrating a temporal change in resistivity of a film having the Ge content of 5 at %. Data illustrated in FIG. 53 is of various Zn/In compositional ratios. It is seen that the resistivity for various Zn/In ratios does not change with time when as small as Ge=5 at % is included.

Figure 55A:
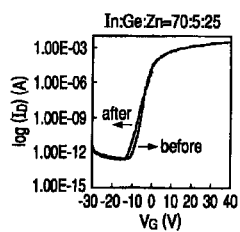
FIGS. 55A, 55B and 55C are graphs illustrating temporal changes of transfer characteristics of In—Ge—Zn—O TFTs in which data is collected just after the devices are fabricated (before) and after three months (after), and the In:Ge:Zn compositional ratio is approximately 70:5:25 in FIG. 55A, 45:5:50 in FIG. 55B, and 32:5:62 in FIG. 55C.
Figure 55B:
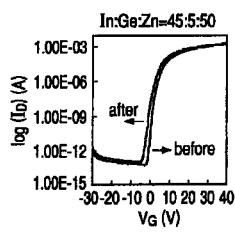
Figure 55C:
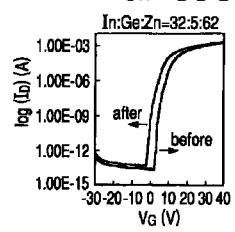

The temporal stability of the characteristics of an In—Ge—Zn—O TFT was examined next. FIGS. 55A, 55B and 55C illustrates the temporal stability of transfer characteristics. As a result, TFT characteristics such as threshold voltage and on/off current ratio hardly changed when the composition was In:Ge:Zn~70:5:25. When the composition was In:Ge:Zn~33:5:62, on the other hand, a shift of the threshold voltage to a smaller positive value was confirmed. However, it was found that this fluctuation of the threshold voltage Vth stopped after a certain period of time and, after that, stable normally-off characteristics were exhibited. When the Ge content is increased to 13 at %, the stability against environment of the high-Zn compositional ratio TFT can be improved even more.

Figure 56:
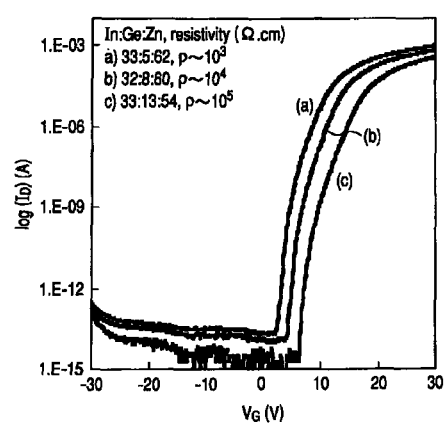
FIG. 56 is a graph illustrating Ge content dependency of the transfer characteristics of an In—Ge—Zn—O TFT.

An In—Ge—Zn—O TFT that exhibits normally-off characteristics is discussed next. Results of this can be found in FIG. 56. FIG. 56 illustrates that the threshold voltage is controllable with the Ge compositional ratio. When the Ge content increases, the threshold voltage shifts toward the positive direction. As to a composition range where the threshold voltage takes a small positive value, the Ge content is between 3 at % and 15 at %.

An In—Ge—Zn—O TFT can thus have fine characteristics in a Ge content range of 3 at % to 15 at %, and characteristics fluctuation is small between devices and between lots. In particular, a high performance TFT that has excellent temporal stability is obtained when an oxide having a In:Ge:Zn compositional ratio of 33:3:64 is used for the TFT's channel layer.

Table 21 is a list of TFT characteristics. Table 21 shows the field effect mobility, the S value, and the threshold voltage at various compositional ratios. Table 21 also shows the characteristics of a device immediately after fabrication and the characteristics of the device three months after the fabrication. It can be seen from the table that the TFT characteristics are stable throughout a wide composition range for a long period of time.

TABLE 21

TFT Characteristics List. Comparison Between Immediately After Fabrication and Three Months Later

| In:Ge:Zn [Atom number ratio] | Immediately after device fabrication | | Three months later | | Von shift in 3 months [V] |
|---|---|---|---|---|---|
| | Field-effect mobility [cm²/Vs] | S-value [V/decade] | Field-effect mobility [cm²/Vs] | S-value [V/decade] | |
| 51:25:24 | 4 | 0.5 | 3.8 | 0.5 | −0.2 |
| 66:8:26 | 11.23 | 1.4 | 13.7 | 1.3 | −2.0 |
| 63:11:26 | 8 | 1.22 | 7 | 0.9 | −2.0 |
| 66:8:26 | 11 | 1.4 | 13.64 | 1.3 | −2.0 |
| 68:5:27 | 13.75 | 1.5 | 15.5 | 0.8 | −2.0 |
| 56:5:39 | 11.2 | 1.1 | 14.7 | 0.84 | −2 |
| 42:13:45 | 7.3 | 0.5 | 7.14 | 0.58 | −1.5 |
| 44:5:50 | 10.5 | 0.64 | 13.6 | 0.7 | −2.6 |
| 32:8:60 | 9.8 | 0.38 | 12 | 0.55 | −5.8 |
| 33:13:54 | 7.05 | 0.2 | 10.32 | 0.5 | −5.2 |
| 44:8:48 | 9.0 | 0.7 | 11.8 | 0.72 | −3.3 |

To summarize with reference to the ternary phase diagram in FIG. 57, a normally-off TFT that has a high on/off current ratio and a fine mobility can be obtained by using a thin film in a composition range that is surrounded by "h", "i", "n", and "t" as the TFT's channel layer. Specifically, a TFT having an on/off current ratio of $10^9$ or more and a field effect mobility of 7 cm²/V s or more can be obtained.

Further, when an In—Ge—Zn—O film in a composition range that is within the above-mentioned composition range and in shaded region enclosed by "s", "u", "t", and "n" can be used as the channel layer, a TFT having exquisite performance and DC drive stress resistance both can be obtained. Specifically, the obtained TFT exhibits normally-off characteristics, has an on/off current ratio of $10^{10}$ or more, a field effect mobility of 10 cm²/V s or more, and an S value of 0.5 V/decade or less, and allows DC drive stress to vary the threshold only by 1 V or less.

As has been described, a thin film according to the present invention can be formed at low temperature and is amorphous, which enables forming of a field effect transistor on a flexible material including a PET film.

A field effect transistor of the present invention can therefore be used as a switching device for LCDs and organic EL displays. Further, the field effect transistor of the present invention has a wide range of possible use in the field of transparent (see-through) displays including flexible displays, IC cards, and IC tags.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-021009, filed Jan. 31, 2008, and Japanese Patent Application No. 2009-015692, filed Jan. 27, 2009, which are hereby incorporated by reference herein in their entirety.

The invention claimed is:

1. A thin film transistor comprising:
a substrate;
a gate electrode;
a gate insulation layer;
a channel layer;
a source electrode; and
a drain electrode,
said gate electrode, gate insulation layer, channel layer, source electrode and drain electrode being formed on said substrate,
wherein said channel layer is amorphous, and the elements present in greatest amounts in said channel layer are indium, germanium, and oxygen;
wherein said channel layer has a compositional ratio expressed by In/(In+Ge) of 0.5-0.75, and
wherein said thin film transistor has an S value that is less than 0.55V/dec.

2. A thin film transistor according to claim 1, wherein said channel layer has a compositional ratio expressed by In/(In+Ge) of 0.6-0.75.

3. A thin film transistor according to claim 1, wherein said channel layer has a specific resistivity of $10^3$ Ω·cm to $10^6$ Ω·cm.

4. A thin film transistor according to claim 1, wherein said gate insulation layer is made of a silicon oxide.

5. A display apparatus that comprises:
an organic light emitting diode; and
a thin film transistor that drives said organic light emitting diode,
said thin film transistor further comprising a substrate, a gate electrode, a gate insulation layer, a channel layer, a source electrode, and a drain electrode, wherein
said gate electrode, gate insulation layer, channel layer, source electrode and drain electrode are formed on said substrate,
said channel layer is amorphous, and the elements present in greatest amounts in said channel layer are indium, germanium, and oxygen;
said channel layer has a compositional ratio expressed by In/(In+Ge) of 0.5-0.75, and
said thin film transistor has an S value that is less than or equal to 0.55V/dec.

6. A display apparatus according to claim 5, wherein said channel layer has a compositional ratio expressed by In/(In+Ge) of 0.6-0.75.

7. A field effect transistor, comprising:
a source and a drain; and
a channel formed from an oxide that contains Zn, In, and Ge,
wherein said channel is amorphous, and the elements present in said channel in greatest amounts are zinc, indium, germanium, and oxygen,
wherein said oxide has a composition inside of a range surrounded by a, n, t, and h in FIG. 57,
and said field effect transistor has an S value less than or equal to 0.7 V/dec.

8. A field effect transistor according to claim 7, wherein said oxide is amorphous.

9. A field effect transistor according to claim 7, wherein said field effect transistor is incorporated in a display that includes an organic light emitting diode.

10. A field effect transistor according to claim 7, wherein said oxide has a composition inside of a range surrounded by h, i, n, and t in FIG. 57.

11. A field effect transistor according to claim 7, wherein said oxide has a composition inside of a range surrounded by s, u, x, y, v, and b in FIG. 57,
and said field effect transistor has an S value that is less than or equal to 0.5V/dec.

12. A field effect transistor according to claim 7, wherein said oxide has a composition inside of a range surrounded by s, u, t, and n in FIG. 57.

13. A field effect transistor according to claim 12, having an off-current of $10^{-13}$ A or less.

14. A field effect transistor according to claim 7, further comprising a gate insulating film made of a silicon oxide.

* * * * *